United States Patent
Xie et al.

(10) Patent No.: US 11,335,293 B2
(45) Date of Patent: May 17, 2022

(54) SHIFT REGISTER UNIT, METHOD OF DRIVING SHIFT REGISTER UNIT, GATE DRIVE CIRCUIT, AND DISPLAY DEVICE

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Yongxian Xie, Beijing (CN); Yifeng Zou, Beijing (CN); Hui Wang, Beijing (CN); Mindong Zheng, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 322 days.

(21) Appl. No.: 16/491,910

(22) PCT Filed: Feb. 18, 2019

(86) PCT No.: PCT/CN2019/075397
§ 371 (c)(1),
(2) Date: Sep. 6, 2019

(87) PCT Pub. No.: WO2019/242317
PCT Pub. Date: Dec. 26, 2019

(65) Prior Publication Data
US 2021/0327384 A1 Oct. 21, 2021

(30) Foreign Application Priority Data
Jun. 21, 2018 (CN) .......................... 201810644213.6

(51) Int. Cl.
*G09G 3/36* (2006.01)

(52) U.S. Cl.
CPC ..... *G09G 3/3677* (2013.01); *G09G 2300/0408* (2013.01); *G09G 2300/0819* (2013.01);
(Continued)

(58) Field of Classification Search
CPC ...... G09G 3/36; G09G 3/3622; G09G 3/3625; G09G 3/3674; G09G 3/3677; G09G 3/3681; G09G 2310/0286; G09G 2310/061
(Continued)

(56) References Cited

U.S. PATENT DOCUMENTS 10,950,320 B2 * 3/2021 Xie ........................ G09G 3/20
11,074,844 B2 * 7/2021 Zou ..................... G09G 3/3677
(Continued)

FOREIGN PATENT DOCUMENTS

| CN | 105161134 A | 12/2015 |
| CN | 105185349 A | 12/2015 |

(Continued)

OTHER PUBLICATIONS

The First Chinese Office Action dated Feb. 3, 2020; Appln. No. 201810644213.6.

*Primary Examiner* — Alexander Eisen
*Assistant Examiner* — Nelson Lam

(57) ABSTRACT

A shift register unit, a method of driving a shift register unit, a gate drive circuit, and a display device are provided. The shift register unit includes an input circuit, an output circuit, a first reset circuit, and a reset control circuit. The input circuit is configured to control a level of a first node; the output circuit is configured to output a clock signal to an output terminal; the first reset circuit is configured to reset the first node; and the reset control circuit is configured to input the first reset signal to the first reset circuit in response to a reset control signal and a reference signal, to turn on the (Continued)

first reset circuit and the reset control circuit is further configured to enable an amplitude of a level of the first reset signal to be larger than an amplitude of a level of the reference signal.

17 Claims, 9 Drawing Sheets

(52) U.S. Cl.
CPC .............. *G09G 2310/0286* (2013.01); *G09G 2310/061* (2013.01)

(58) Field of Classification Search
USPC .................................................. 345/87–104
See application file for complete search history.

(56) References Cited

U.S. PATENT DOCUMENTS

| | | | |
|---|---|---|---|
| 11,132,934 B2* | 9/2021 | Xie | ........................... G09G 3/20 |
| 2010/0245298 A1 | 9/2010 | Chen et al. | |
| 2016/0049128 A1* | 2/2016 | Shao | ...................... G11C 19/28 |
| | | | 345/204 |
| 2016/0172054 A1* | 6/2016 | Shao | .................... G11C 19/184 |
| | | | 345/100 |
| 2016/0351156 A1* | 12/2016 | Wu | ...................... G09G 3/3677 |
| 2017/0345515 A1 | 11/2017 | Shang | |
| 2018/0174659 A1* | 6/2018 | Shao | ...................... G11C 19/28 |
| 2018/0190232 A1* | 7/2018 | Xue | ...................... G09G 3/3677 |
| 2019/0287446 A1* | 9/2019 | Liao | ...................... G11C 19/28 |
| 2019/0295674 A1* | 9/2019 | Zhang | .................... G11C 19/28 |
| 2020/0098441 A1* | 3/2020 | Zhang | .................. G11C 19/287 |
| 2021/0193001 A1* | 6/2021 | Feng | ...................... G11C 19/28 |

FOREIGN PATENT DOCUMENTS

| | | |
|---|---|---|
| CN | 105609072 A | 5/2016 |
| CN | 105702194 A | 6/2016 |
| CN | 106847221 A | 6/2017 |
| CN | 107464539 A | 12/2017 |
| CN | 108062938 A | 5/2018 |
| CN | 108806628 A | 11/2018 |
| KR | 1020060044118 A | 5/2006 |
| KR | 1020130010715 A | 1/2013 |
| KR | 1020160068081 A | 6/2016 |

* cited by examiner

SHIFT REGISTER UNIT, METHOD OF DRIVING SHIFT REGISTER UNIT, GATE DRIVE CIRCUIT, AND DISPLAY DEVICE

The present application claims priority of Chinese Patent Application No. 201810644213.6, filed on Jun. 21, 2018, the disclosure of which is incorporated herein by reference in its entirety as part of the present application.

TECHNICAL FIELD

Embodiments of the present disclosure relate to a shift register unit, a method of driving a shift register unit, a gate drive circuit, and a display device.

BACKGROUND

In the field of display technologies, for example, a pixel array of a liquid crystal display panel generally comprises a plurality of rows of gate lines and a plurality of columns of data lines, and the plurality of rows of gate lines are interlaced with the plurality of columns of data lines. The driving of the gate lines can be achieved by a gate drive circuit. For example, the gate drive circuit can be implemented by a bonded integrated drive circuit. In recent years, with continuous improvement of the preparation process of amorphous silicon thin film transistors or oxide thin film transistors, the gate drive circuit can also be directly integrated on a thin film transistor array substrate to form a gate-driver on array (GOA) to drive the gate lines. For example, a GOA comprising a plurality of cascaded shift register units may be used to provide on-state and off-state voltage signals for the plurality of rows of gate lines of the pixel array, thereby, for example, controlling the plurality of rows of gate lines to be sequentially turned on, and meanwhile, data signals are provided to pixel units of a corresponding row in the pixel array through the data lines. Therefore, voltages required for respective gray scales of a displayed image are generated in respective pixel units, and thus a frame image is displayed. Currently, display panels increasingly adopt GOA technology to drive the gate lines. The GOA technology is conducive to achieving a narrow frame and reducing production costs.

SUMMARY

At least one embodiment of the present disclosure provides a shift register unit, which comprises an input circuit, an output circuit, a first reset circuit, and a reset control circuit. The input circuit is configured to control a level of a first node in response to an input signal; the output circuit is configured to output a clock signal to an output terminal under control of the level of the first node; the first reset circuit is configured to reset the first node in response to a first reset signal; and the reset control circuit is configured to input the first reset signal to the first reset circuit in response to a reset control signal and a reference signal, to turn on the first reset circuit.

For example, in the shift register unit provided by an embodiment of the present disclosure, the reset control circuit is further configured to enable an amplitude of a level of the first reset signal to be greater than an amplitude of a level of the reference signal.

For example, in the shift register unit provided by an embodiment of the present disclosure, the reset control circuit comprises: a drive sub-circuit, configured to adjust a level of a reset control node according to the reset control signal and the reference signal and adopt the level of the reset control node as the first reset signal; and a reset sub-circuit, configured to reset the reset control node and the drive sub-circuit in response to a reset sub-signal.

For example, in the shift register unit provided by an embodiment of the present disclosure, the drive sub-circuit comprises a first capacitor and a first transistor, a first electrode of the first capacitor is configured to be connected to a reset control signal terminal to receive the reset control signal, a second electrode of the first capacitor is configured to be connected to a reference signal terminal to receive the reference signal, a gate electrode of the first transistor is configured to be connected to the first electrode of the first capacitor, a first electrode of the first transistor is configured to be connected to the second electrode of the first capacitor, and a second electrode of the first transistor is configured to be connected to the reset control node; and the reset sub-circuit comprises a second transistor and a third transistor, a gate electrode of the second transistor is configured to be connected to a reset sub-signal terminal to receive the reset sub-signal, a first electrode of the second transistor is configured to be connected to the gate electrode of the first transistor, a second electrode of the second transistor is configured to be connected to a first voltage terminal to receive a first voltage, a gate electrode of the third transistor is configured to be connected to the reset sub-signal terminal to receive the reset sub-signal, a first electrode of the third transistor is configured to be connected to the reset control node, and a second electrode of the third transistor is configured to be connected to the first voltage terminal.

For example, in the shift register unit provided by an embodiment of the present disclosure, the reference signal terminal is connected to a clock signal terminal to receive the clock signal as the reference signal.

For example, the shift register unit provided by an embodiment of the present disclosure comprises a first control circuit, a second control circuit, a third control circuit, a fourth control circuit, a first node noise reduction circuit, and an output noise reduction circuit; the first control circuit is configured to control a level of a second node under control of the level of the first node and a level of a first control node; the second control circuit is configured to control a level of a third node under control of the level of the first node and a level of a second control node; the third control circuit is configured to control the level of the first control node under control of the level of the first node; the fourth control circuit is configured to control the level of the second control node under control of the level of the first node; the first node noise reduction circuit is configured to perform noise reduction on the first node under control of the level of the second node or the level of the third node; and the output noise reduction circuit is configured to perform noise reduction on the output terminal under control of the level of the second node or the level of the third node.

For example, in the shift register unit provided by an embodiment of the present disclosure, the input circuit comprises a fourth transistor, a gate electrode of the fourth transistor is connected to a first electrode of the fourth transistor and is configured to be connected to an input terminal to receive the input signal, and a second electrode of the fourth transistor is configured to be connected to the first node.

For example, in the shift register unit provided by an embodiment of the present disclosure, the output terminal of the output circuit comprises at least one shift signal output terminal and at least one pixel signal output terminal.

For example, in the shift register unit provided by an embodiment of the present disclosure, the output circuit comprises a fifth transistor, a sixth transistor, and a second capacitor, a gate electrode of the fifth transistor is configured to be connected to the first node, a first electrode of the fifth transistor is configured to be connected to a clock signal terminal to receive the clock signal, and a second electrode of the fifth transistor is configured to be connected to the shift signal output terminal; a gate electrode of the sixth transistor is configured to connected to the first node, a first electrode of the sixth transistor is configured to be connected to the clock signal terminal to receive the clock signal, and a second electrode of the sixth transistor is configured to be connected to the pixel signal output terminal; and a first electrode of the second capacitor is configured to be connected to the first node, and a second electrode of the second capacitor is configured to be connected to the second electrode of the sixth transistor or the second electrode of the fifth transistor.

For example, in the shift register unit provided by an embodiment of the present disclosure, the first reset circuit comprises a seventh transistor, a gate electrode of the seventh transistor is configured to be connected to the reset control node, a first electrode of the seventh transistor is configured to be connected to the first node, and a second electrode of the seventh transistor is configured to be connected to a first voltage terminal to receive a first voltage.

For example, in the shift register unit provided by an embodiment of the present disclosure, the first control circuit comprises an eighth transistor and a ninth transistor, a gate electrode of the eighth transistor is configured to be connected to the first control node, a first electrode of the eighth transistor is configured to be connected to a second voltage terminal to receive a second voltage, a second electrode of the eighth transistor is configured to be connected to the second node, a gate electrode of the ninth transistor is configured to be connected to the first node, a first electrode of the ninth transistor is configured to be connected to the second node, and a second electrode of the ninth transistor is configured to be connected to a first voltage terminal to receive a first voltage; and the second control circuit comprises a tenth transistor and an eleventh transistor, a gate electrode of the tenth transistor is configured to be connected to the second control node, a first electrode of the tenth transistor is configured to be connected to a third voltage terminal to receive a third voltage, a second electrode of the tenth transistor is configured to be connected to the third node, a gate electrode of the eleventh transistor is configured to be connected to the first node, a first electrode of the eleventh transistor is configured to be connected to the third node, and a second electrode of the eleventh transistor is configured to be connected to the first voltage terminal.

For example, in the shift register unit provided by an embodiment of the present disclosure, the third control circuit comprises a twelfth transistor and a thirteenth transistor, a gate electrode of the twelfth transistor is connected to a first electrode of the twelfth transistor and is configured to be connected to a second voltage terminal to receive a second voltage, a second electrode of the twelfth transistor is configured to be connected to the first control node, a gate electrode of the thirteenth transistor is configured to be connected to the first node, a first electrode of the thirteenth transistor is configured to be connected to the first control node, and a second electrode of the thirteenth transistor is configured to be connected to a first voltage terminal to receive a first voltage; and the fourth control circuit comprises a fourteenth transistor and a fifteenth transistor, a gate electrode of the fourteenth transistor is connected to a first electrode of the fourteenth transistor and is configured to be connected to a third voltage terminal to receive a third voltage, a second electrode of the fourteenth transistor is configured to be connected to the second control node, a gate electrode of the fifteenth transistor is configured to be connected to the first node, a first electrode of the fifteenth transistor is configured to be connected to the second control node, and a second electrode of the fifteenth transistor is configured to be connected to the first voltage terminal.

For example, in the shift register unit provided by an embodiment of the present disclosure, the first node noise reduction circuit comprises a sixteenth transistor and a seventeenth transistor; a gate electrode of the sixteenth transistor is configured to be connected to the second node, a first electrode of the sixteenth transistor is configured to be connected to the first node, and a second electrode of the sixteenth transistor is configured to be connected to a first voltage terminal to receive a first voltage; and a gate electrode of the seventeenth transistor is configured to be connected to the third node, a first electrode of the seventeenth transistor is configured to be connected to the first node, and a second electrode of the seventeenth transistor is configured to be connected to the first voltage terminal.

For example, in the shift register unit provided by an embodiment of the present disclosure, the output noise reduction circuit comprises an eighteenth transistor, a nineteenth transistor, a twentieth transistor, and a twenty-first transistor, a gate electrode of the eighteenth transistor is configured to be connected to the second node, a first electrode of the eighteenth transistor is configured to be connected to the shift signal output terminal, and a second electrode of the eighteenth transistor is configured to be connected to a first voltage terminal to receive a first voltage; a gate electrode of the nineteenth transistor is configured to be connected to the third node, a first electrode of the nineteenth transistor is configured to be connected to the shift signal output terminal, and a second electrode of the nineteenth transistor is configured to be connected to the first voltage terminal; a gate electrode of the twentieth transistor is configured to be connected to the second node, a first electrode of the twentieth transistor is configured to be connected to the pixel signal output terminal, and a second electrode of the twentieth transistor is configured to be connected to a fourth voltage terminal to receive a fourth voltage; and a gate electrode of the twenty-first transistor is configured to be connected to the third node, a first electrode of the twenty-first transistor is configured to be connected to the pixel signal output terminal, and a second electrode of the twenty-first transistor is configured to be connected to the fourth voltage terminal.

For example, the shift register unit provided by an embodiment of the present disclosure comprises a second reset circuit, and the second reset circuit is configured to reset the first node in response to a second reset signal.

For example, in the shift register unit provided by an embodiment of the present disclosure, the second reset circuit comprises a twenty-second transistor, a gate electrode of the twenty-second transistor is configured to be connected to a second reset terminal to receive the second reset signal, a first electrode of the twenty-second transistor is configured to be connected to the first node, and a second electrode of the twenty-second transistor is configured to be connected to a first voltage terminal to receive a first voltage.

At least one embodiment of the present disclosure further provides a gate drive circuit, which comprises the shift register unit according to any one of the embodiments of the present disclosure.

At least one embodiment of the present disclosure further provides a display device, which comprises the gate drive circuit according to any one of the embodiments of the present disclosure.

At least one embodiment of the present disclosure further provides a method of driving the shift register unit according to any one of the embodiments of the present disclosure, and the method of driving the shift register unit comprises: in an input phase, the input circuit controlling the level of the first node to a first level in response to the input signal, and the output circuit outputting a second level of the clock signal to the output terminal; in an output phase, the output circuit outputting a third level of the clock signal to the output terminal; and in a first reset phase, the reset control circuit inputting the first reset signal to the first reset circuit in response to the reset control signal and the reference signal, to turn on the first reset circuit and to enable the first reset circuit to reset the first node.

For example, in the method of driving the shift register unit provided by an embodiment of the present disclosure, the clock signal and the reference signal are a same signal, are periodic pulses in the input phase and in the output phase, and are direct current signals in the first reset phase.

BRIEF DESCRIPTION OF THE DRAWINGS

In order to clearly illustrate the technical solutions of the embodiments of the disclosure, the drawings of the embodiments will be briefly described in the following; it is obvious that the described drawings are only related to some embodiments of the disclosure and thus are not limitative to the disclosure.

DETAILED DESCRIPTION

Figure 1:
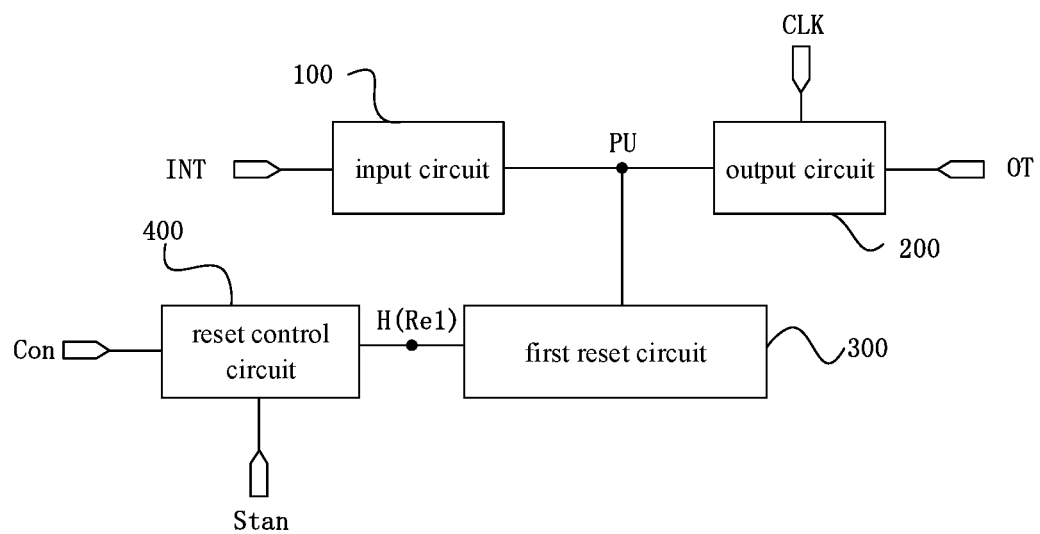
FIG. 1 is a schematic block diagram of a shift register unit provided by some embodiments of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

The GOA technology has certain advantages over a traditional technology of bonding IC chips in terms of reducing the manufacturing cost of the display device and improving the appearance of the display device. However, a shift register unit of a GOA circuit is prone to a problem that noise reduction at a pull-up node is insufficient, thereby generating a multi-output phenomenon, which greatly reduces the quality of the product. The multi-output phenomenon of GOA is the most common and serious abnormal phenomenon of GOA. There are many reasons for generating multi-output, for example, the pull-up node of the shift register unit is not completely discharged after displaying one frame of image, or a channel current (Ids) of a noise reduction transistor (a transistor used for performing noise reduction on the pull-up node) is lowered in a low temperature environment, and the like. In the low temperature environment, the channel current of the noise reduction transistor is reduced, and the noise reduction cannot be sufficiently performed on the pull-up node, and the accumulation of charges on the pull-up node causes the output terminal to generate multi-output. The multi-output phenomenon not only affects the display of a row of pixel units corresponding to the shift register unit, but also affects the display of other rows of pixel units due to a cascade relationship of the shift register units, eventually resulting in an abnormality of the image display.

At least one embodiment of the present disclosure provides a shift register unit, a method of driving a shift register unit, a gate drive circuit, and a display device. The shift register unit can sufficiently reduce the noise of a first node (such as a pull-up node), and solve the problem of insufficient noise reduction of the first node caused by a decrease in a channel current of a noise reduction transistor in a low temperature environment, thereby avoiding a phenomenon of multi-output and ensuring the normal operation of the product.

Hereinafter, the embodiments of the present disclosure are described in detail with reference to the accompanying drawings. It should be noted that the same reference numeral can be used in different drawings to refer to the same element that is described.

At least one embodiment of the present disclosure provides a shift register unit, and the shift register unit comprises an input circuit, an output circuit, a first reset circuit, and a reset control circuit. The input circuit is configured to control a level of a first node in response to an input signal; the output circuit is configured to output a clock signal to an output terminal under control of the level of the first node; the first reset circuit is configured to reset the first node in response to a first reset signal; and the reset control circuit is configured to input the first reset signal to the first reset circuit in response to a reset control signal and a reference signal, to turn on the first reset circuit.

FIG. 1 is a schematic block diagram of a shift register unit provided by some embodiments of the present disclosure. Referring to FIG. 1, a shift register unit 10 comprises an input circuit 100, an output circuit 200, a first reset circuit 300, and a reset control circuit 400. It should be noted that, in the description of various embodiments of the present disclosure, a pull-up node PU is an example of a first node, a case that the first node is the pull-up node PU is taken as an example to describe the present disclosure below, but this does not constitute a limitation on the embodiments of the present disclosure.

The input circuit 100 is configured to control a level of the pull-node PU of the shift register unit 10 in response to an input signal. For example, in an example, the input signal is written into the pull-up node PU and charges the pull-up node PU to raise the level of the pull-up node PU. For example, the input circuit 100 is connected to an input terminal INT, and is configured to electrically connect the pull-up node PU with the input terminal INT under control of the input signal provided by the input terminal INT, so that a high level of the input signal can charge the pull-up node PU to change (for example, raise) the level of the pull-up node PU, so as to control the output circuit 200 to be turned on. Certainly, the embodiments of the present disclosure are not limited thereto, and for example, the input circuit 100 may also be connected to a separately provided high voltage terminal, and is configured to electrically connect the pull-up node PU with the high voltage terminal under control of the input signal provided by the input terminal INT, so that a high-level signal output by the high voltage terminal can charge the pull-up node PU.

The output circuit 200 is configured to output a clock signal CLK to an output terminal OT of the shift register unit 10 under control of the level of the pull-up node PU, and the clock signal CLK serves as an output signal of the shift register unit 10 to drive, for example, a gate line of a display panel connected to the output terminal OT. For example, the output circuit 200 is connected to a clock signal terminal CLK, the pull-up node PU, and the output terminal OT, and is configured to be turned on under control of the level of the pull-up node PU, so that the clock signal terminal CLK and the output terminal OT are electrically connected, thereby outputting the clock signal provided by the clock signal terminal CLK to the output terminal OT.

The first reset circuit 300 is configured to reset the pull-up node PU in response to a first reset signal Re1. For example, the first reset circuit 300 is connected to the pull-up node PU and a reset control node H, and is configured to electrically connect the pull-up node PU with an additionally provided low voltage terminal under control of a level of the reset control node H, so as to reset the pull-up node PU. In the embodiments of the present disclosure, the level of the reset control node H serves as the first reset signal Re1 to control whether the first reset circuit 300 is turned on or not. For example, the first reset circuit 300 may reset the pull-up node PU before the scanning of one frame of image starts and after the scanning of one frame of image ends, and may also reset the pull-up node PU only after the scanning of one frame of image ends.

The reset control circuit 400 is configured to input the first reset signal Re1 to the first reset circuit 300 in response to a reset control signal and a reference signal, to turn on the first reset circuit 300. For example, the reset control circuit 400 is connected to a reset control signal terminal Con, a reference signal terminal Stan, and the reset control node H, and is configured to adjust an amplitude of the reference signal provided by the reference signal terminal Stan under control of the reset control signal provided by the reset control signal terminal Con and provide the adjusted signal to the reset control node H, and the level of the reset control node H serves as the first reset signal Re1 to control the first reset circuit 300 to be turned on.

For example, the reset control circuit 400 is also configured to enable the amplitude of the level of the first reset signal Re1 to be greater than the amplitude of the level of the reference signal. For example, in an example, the reset control circuit 400 pulls the amplitude of the reference signal up to high and provides the pulled reference signal to the reset control node H, and the first reset circuit 300 is turned on under control of the high level of the reset control node H. At this time, the level of the reset control node H (the level of the first reset signal Re1) is higher than the level of the reference signal, therefore, compared with a case where the reference signal is directly applied to the first reset circuit 300 to control the first reset circuit 300, the first reset circuit 300 can be sufficiently turned on, so as to perform sufficient noise reduction (reset) on the pull-up node PU, and furthermore, the problem of insufficient noise reduction of the pull-up node PU caused by a decrease in a channel current of a noise reduction transistor in a low temperature environment is solved, thereby avoiding the phenomenon of multi-output and ensuring the normal operation of the product. Certainly, the embodiments of the present disclosure are not limited thereto. For example, in another example, the first reset circuit 300 is turned on under control of a low level (the low level is greater than 0V), in a case where the pull-up node PU needs to be reset, the reset control circuit 400 pulls the amplitude of the reference signal down to low and supplies the pulled signal to the reset control node H, and the first reset circuit 300 is turned on under control of the low level of the reset control node H. At this time, the level of the reset control node H (the level of the first reset signal Re1) is lower than the level of the reference signal, and therefore, the first reset circuit 300 can be sufficiently turned on, so as to perform sufficient noise reduction on the pull-up node PU.

For example, the reference signal terminal Stan may also be connected to the clock signal terminal CLK, so that the clock signal serves as the reference signal, so long as that the clock signal outputs a corresponding direct current (DC) signal (for example, a high level signal or a low level signal) in a case where the first rest circuit 300 needs to be turned on, and this method can reduce the number of signal lines and facilitate to design route. Of course, the embodiments of the present disclosure are not limited thereto, and the reference signal terminal Stan may also be connected to other signal terminals and voltage terminals as long as the signals satisfy the requirements.

Figure 2:
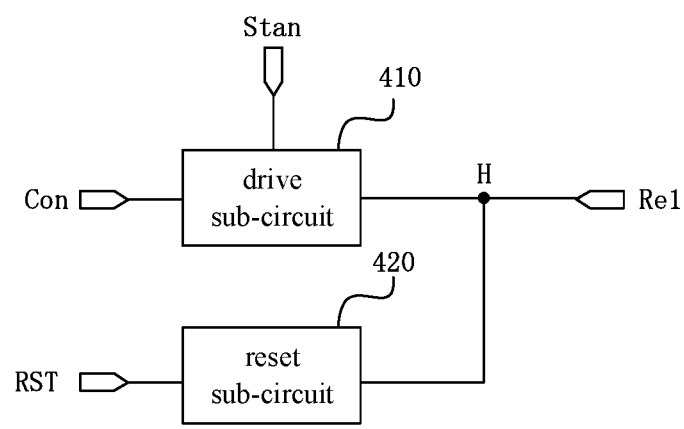
FIG. 2 is a schematic block diagram of a reset control circuit of a shift register unit provided by some embodiments of the present disclosure.

FIG. 2 is a schematic block diagram of a reset control circuit of a shift register unit provided by some embodiments of the present disclosure. Referring to FIG. 2, the reset control circuit 400 comprises a drive sub-circuit 410 and a reset sub-circuit 420.

The drive sub-circuit 410 is configured to adjust (for example, perform charging) the level of the reset control node H according to the reset control signal and the reference signal and adopt the level of the reset control node H as the first reset signal Re1. For example, the drive sub-circuit 410 is connected to the reset control signal terminal Con, the reference signal terminal Stan, and the reset control node H, and is configured to adjust the amplitude of the reference signal provided by the reference signal terminal Stan under control of the reset control signal supplied from the reset control signal terminal Con and charge the reset control node H with the adjusted signal.

The reset sub-circuit 420 is configured to reset the reset control node H and the drive sub-circuit 410 in response to a reset sub-signal. For example, the reset sub-circuit 420 is connected to a reset sub-signal terminal RST and the reset control node H, and is configured to electrically connect the reset control node H with the additionally provided low voltage terminal under control of the reset sub-signal provided by the reset sub-signal terminal RST, thereby resetting the reset control node H and the drive sub-circuit 410.

Figure 3:
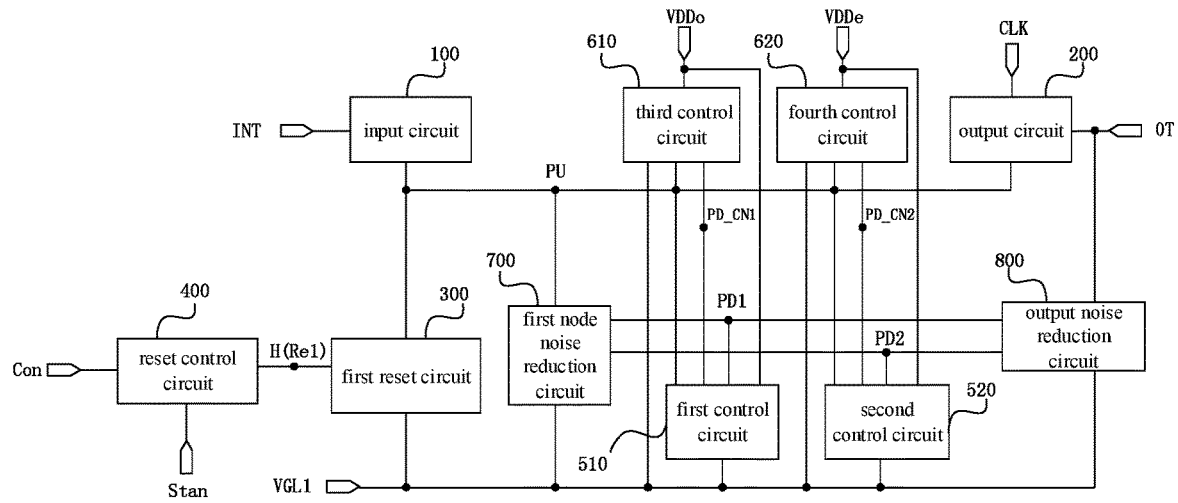
FIG. 3 is a schematic block diagram of another shift register unit provided by some embodiments of the present disclosure.

FIG. 3 is a schematic block diagram of another shift register unit provided by some embodiments of the present disclosure. Referring to FIG. 3, in this embodiment, the shift register unit 10 further comprises a first control circuit 510, a second control circuit 520, a third control circuit 610, a fourth control circuit 620, a first node noise reduction circuit 700, and an output noise reduction circuit 800, and the other structures of the shift register unit 10 are substantially the same as those of the shift register unit 10 illustrated in FIG. 1. It should be noted that, in the descriptions of various embodiments of the present disclosure, a first pull-down node PD1 is an example of a second node, and a second pull-down node PD2 is an example of a third node, a case where the second node is the first pull-down node PD1 and the third node is the second pull-down node PD2 is taken as an example to describe the present disclosure below, but this does not constitute a limitation on the embodiments of the present disclosure.

The first control circuit 510 is configured to control a level of the first pull-down node PD1 under control of the level of the pull-up node PU and a level of a first control node PD_CN1. For example, the first control circuit 510 is connected to a first voltage terminal VGL1, a second voltage terminal VDDo, the pull-up node PU, the first pull-down node PD1, and the first control node PD_CN1, and is configured to electrically connect the first pull-down node PD1 with the first voltage terminal VGL1 under control of the level of the pull-up node PU, thereby performing a pulling-down control on the level of the first pull-down node PD1 and enabling the level of the first pull-down node PD1 to be a low level. The first voltage terminal VGL1 is configured, for example, to maintain to input a DC low level signal, and the DC low level signal is referred to as a first voltage, and the following embodiments are the same as those described herein and are not described again. Meanwhile, the first control circuit 510 can electrically connect the first pull-down node PD1 with the second voltage terminal VDDo under control of the level of the first control node PD_CN1, so that in a case where the second voltage terminal VDDo provides a high level signal, the first pull-down node PD1 is charged to be at a high level, and in a case where the second voltage terminal VDDo provides a low level signal, the first pull-down node PD1 is discharged.

The second control circuit 520 is configured to control a level of the second pull-down node PD2 under control of the level of the pull-up node PU and a level of a second control node PD_CN2. For example, the second control circuit 520 is connected to the first voltage terminal VGL1, a third voltage terminal VDDe, the pull-up node PU, the second pull-down node PD2, and the second control node PD_CN2, and is configured to electrically connect the second pull-down node PD2 with the first voltage terminal VGL1 under control of the level of the pull-up node PU, thereby performing a pulling-down control on the level of the second pull-down node PD2 and enabling the level of the second pull-down node PD2 to be a low level. Meanwhile, the second control circuit 520 can electrically connect the second pull-down node PD2 with the third voltage terminal VDDe under control of the level of the second control node PD_CN2, so that in a case where the third voltage terminal VDDe provides a high level signal, the second pull-down node PD2 is charged to be at a high level, and in a case where the third voltage terminal VDDe provides a low level signal, the second pull-down node PD2 is discharged.

The third control circuit 610 is configured to control the level of the first control node PD_CN1 under control of the level of the pull-up node PU. For example, the third control circuit 610 is connected to the first voltage terminal VGL1, the second voltage terminal VDDo, the pull-up node PU, and the first control node PD_CN1, and is configured to electrically connect the first control node PD_CN1 with the first voltage terminal VGL1 under control of the level of the pull-up node PU, thereby performing a pulling-down control on the level of the first control node PD_CN1 and enabling the level of the first control node PD_CN1 to be a low level. Meanwhile, the third control circuit 610 may enable the first control node PD_CN1 to be at a high level in a case where the second voltage terminal VDDo supplies a high level signal.

The fourth control circuit 620 is configured to control the level of the second control node PD_CN2 under control of the level of the pull-up node PU. For example, the fourth control circuit 620 is connected to the first voltage terminal VGL1, the third voltage terminal VDDe, the pull-up node PU, and the second control node PD_CN2, and is configured to electrically connect the second control node PD_CN2 with the first voltage terminal VGL1 under control of the level of the pull-up node PU, thereby performing a pulling-down control on the level of the second control node PD_CN2 and enabling the level of the second control node PD_CN2 to be a low level. Meanwhile, the fourth control circuit 620 may enable the second control node PD_CN2 to be at a high level in a case where the third voltage terminal VDDe supplies a high level signal.

The first node noise reduction circuit 700 is configured to perform noise reduction on the pull-up node PU under control of the level of the first pull-down node PD1 or the level of the second pull-down node PD2. For example, the first node noise reduction circuit 700 is connected to the first voltage terminal VGL1, the pull-up node PU, the first pull-down node PD1, and the second pull-down node PD2, and is configured to electrically connect the pull-up node PU with the first voltage terminal VGL1 under control of the level of the first pull-down node PD1 or the level of the second pull-down node PD2, thereby performing pulling-down noise reduction on the pull-up node PU.

The output noise reduction circuit 800 is configured to perform noise reduction on the output terminal OT under control of the level of the first pull-down node PD1 or the level of the second pull-down node PD2. For example, the output noise reduction circuit 800 is connected to the first voltage terminal VGL1, the output terminal OT, the first pull-down node PD1, and the second pull-down node PD2, and is configured to electrically connect the output terminal OT with the first voltage terminal VGL1 under control of the level of the first pull-down node PD1 or the level of the second pull-down node PD2, thereby performing pulling-down noise reduction on the output terminal OT.

It should be noted that, in the embodiments of the present disclosure, the second voltage terminal VDDo and the third voltage terminal VDDe are configured to alternately provide a DC high level signal, the first pull-down node PD1 and the second pull-down node PD2 are alternately at a high level under control of the third control circuit 610, the fourth control circuit 620, the first control circuit 510, and the second control circuit 520, thereby controlling the first node noise reduction circuit 700 and the output noise reduction circuit 800 to perform noise reduction on the pull-up node PU and the output terminal OT, respectively. For example, in a case where the second voltage terminal VDDo provides a high level signal, the third voltage terminal VDDe provides a low level signal, and at this time, the first pull-down node PD1 is at a high level; in a case where the third voltage terminal VDDe provides a high level signal, the second voltage terminal VDDo provides a low level signal, and at this time, the second pull-down node PD2 is at a high level. In this way, the performance drift caused by long-term turn-on of the transistors in the shift register unit 10 can be avoided. For example, a signal provided by the second voltage terminal VDDo is referred to as a second voltage, a signal provided by the third voltage terminal VDDe is referred to as a third voltage, and the following embodiments are the same as those described herein and are not described again.

Figure 4:
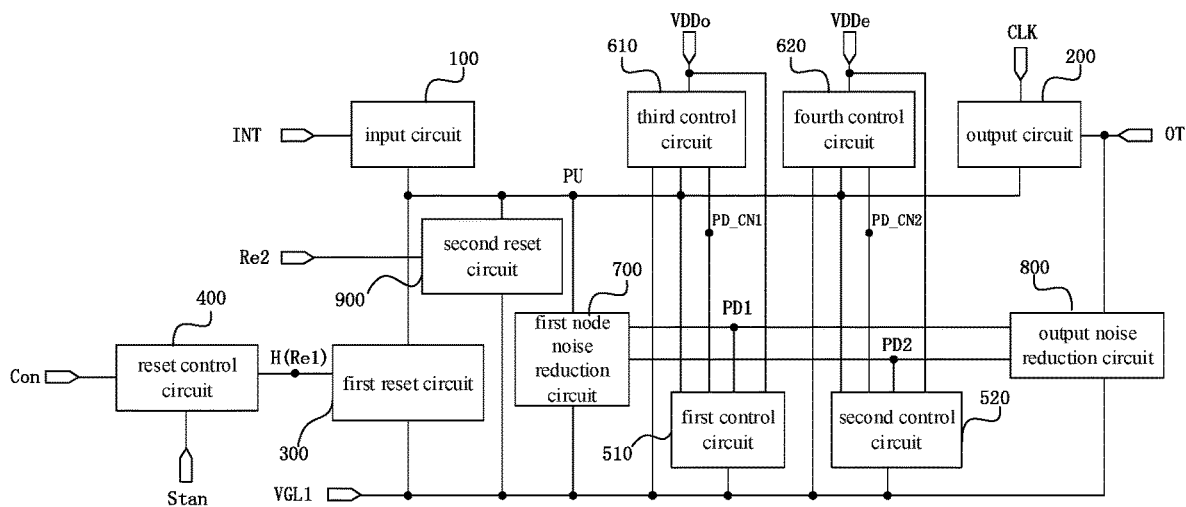
FIG. 4 is a schematic block diagram of still another shift register unit provided by some embodiments of the present disclosure.

FIG. 4 is a schematic block diagram of still another shift register unit provided by some embodiments of the present disclosure. Referring to FIG. 4, in this embodiment, the shift register unit 10 further comprises a second reset circuit 900, and the other structures of the shift register unit 10 are substantially the same as those of the shift register unit 10 illustrated in FIG. 3.

The second reset circuit 900 is configured to reset the pull-up node PU in response to a second reset signal. For example, the second reset circuit 900 is connected to the pull-up node PU, a second reset signal terminal Re2, and the first voltage terminal VGL1, and is configured to electrically connect the pull-up node PU with the first voltage terminal VGL1 under control of the second reset signal provided by the second reset signal terminal Re2, thereby resetting the pull-up node PU. For example, the second reset circuit 900 resets the pull-up node PU after the output of the shift register unit 10 ends.

Figure 5:
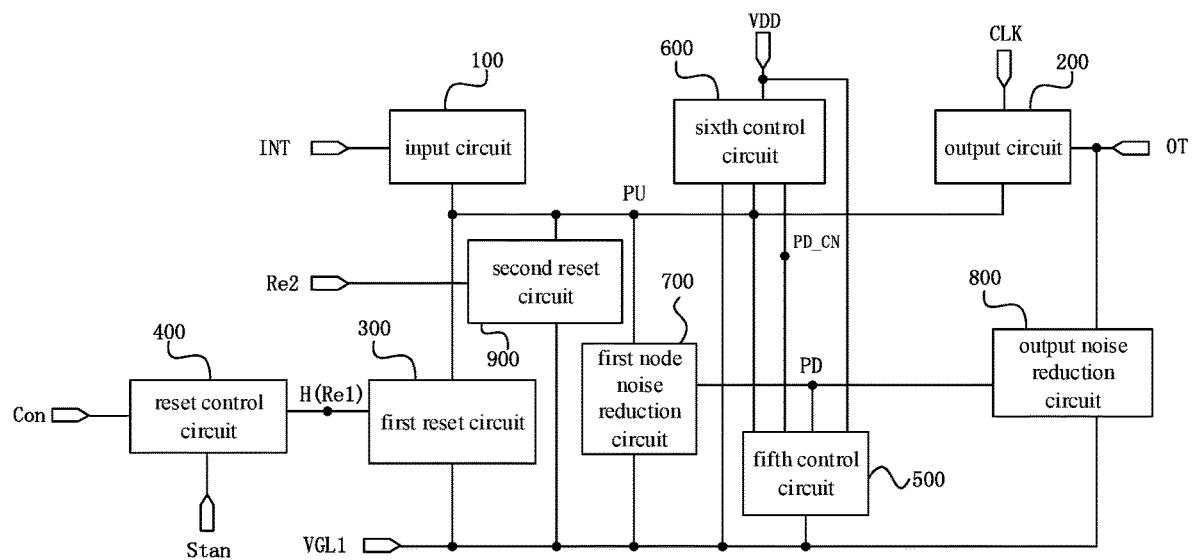
FIG. 5 is a schematic block diagram of yet another shift register unit provided by some embodiments of the present disclosure.

FIG. 5 is a schematic block diagram of yet another shift register unit provided by some embodiments of the present disclosure. Referring to FIG. 5, compared with the shift register unit 10 illustrated in FIG. 4, in this embodiment, the shift register unit 10 comprises a fifth control circuit 500 and a sixth control circuit 600, and correspondingly further comprises a fourth node PD and a third control node PD_CN. The sixth control circuit 600 is connected to a power supply voltage terminal VDD, the power supply voltage terminal VDD is configured, for example, to maintain to input a DC high level signal, and the DC high level signal is referred to as a power supply voltage, and the following embodiments are the same as those described herein and are not described again. The first node noise reduction circuit 700 and the output noise reduction circuit 800 respectively perform noise reduction on the pull-up node PU and the output terminal OT under control of a level of the fourth node PD. The shift register unit 10 has a simple circuit structure, is easy to be manufactured and processed, and facilitates to implement a narrow frame. The other structures of the shift register unit 10 are substantially the same as those of the shift register unit 10 illustrated in FIG. 4, and details are not described herein again.

It should be noted that, in the embodiments of the present disclosure, the shift register unit 10 can be obtained by a combination of the reset control circuit 400 and a shift register unit of any conventional configuration, and is not limited to the above-described configuration. The reset control circuit 400 can enable the amplitude of the level of the first reset signal Re1 to be greater than the amplitude of the level of the reference signal, and enable the first reset circuit 300 to be turned on sufficiently, so as to perform sufficient noise reduction (reset) on the pull-up node PU, thereby avoiding the phenomenon of multi-output.

Figure 6:
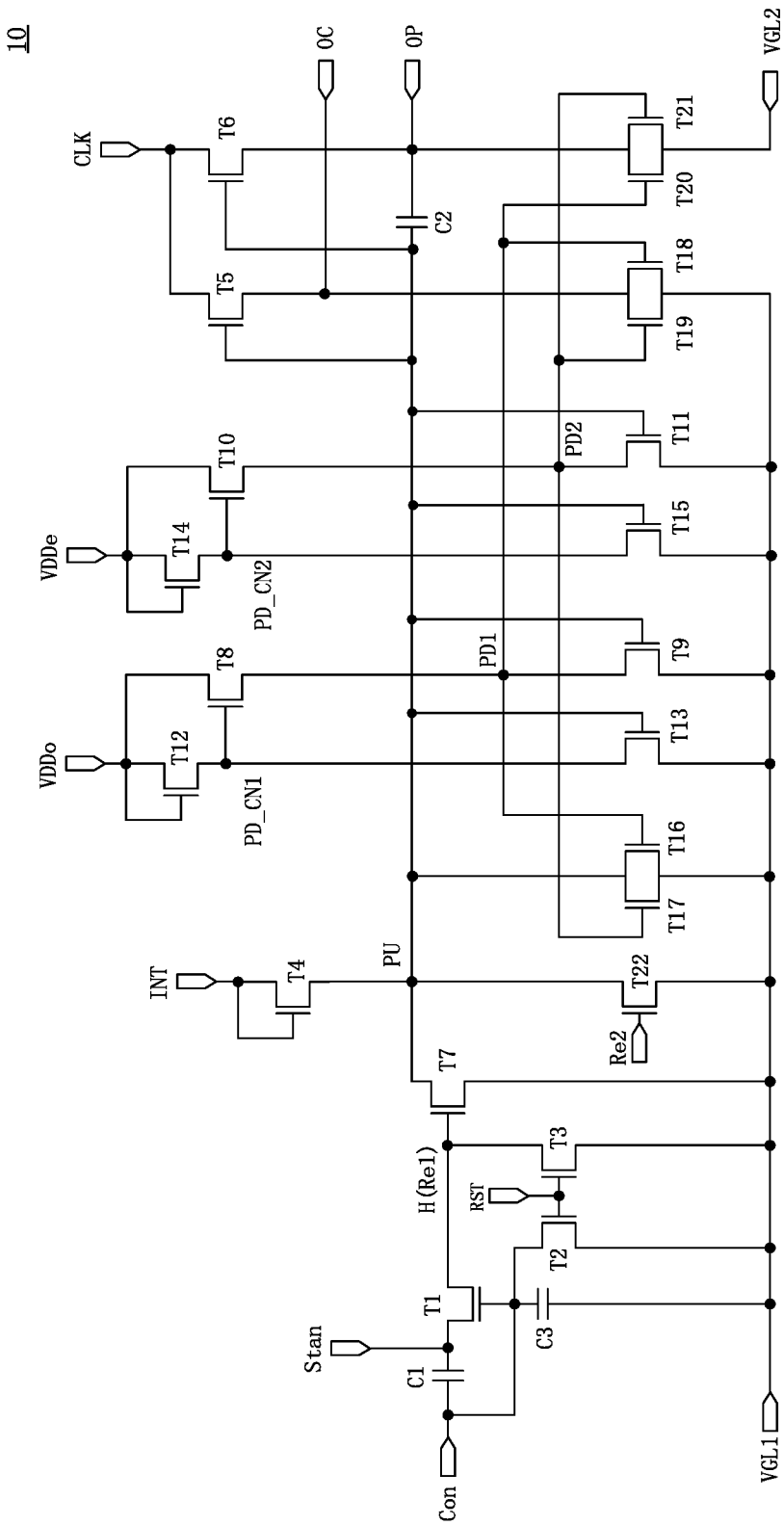
FIG. 6 is a circuit diagram of a specific implementation example of the shift register unit illustrated in FIG. 4.

FIG. 6 is a circuit diagram of a specific implementation example of the shift register unit illustrated in FIG. 4. The following descriptions are described by taking a case where each transistor is an N-type transistor as an example, but this does not constitute a limitation on the embodiments of the present disclosure. Referring to FIG. 6, the shift register unit 10 comprises first to twenty-second transistors T1-T22, and further comprises first to third capacitors C1-C3.

For example, the reset control circuit 400 comprises the drive sub-circuit 410 and the reset sub-circuit 420. As illustrated in FIG. 6, the drive sub-circuit 410 can be implemented as a first capacitor C1 and a first transistor T1. A first electrode of the first capacitor C1 is configured to be connected to the reset control signal terminal Con to receive the reset control signal, and a second electrode of the first capacitor C1 is configured to be connected to the reference signal terminal Stan to receive the reference signal. A gate electrode of the first transistor T1 is configured to be connected to the first electrode of the first capacitor C1, a first electrode of the first transistor T1 is configured to be connected to the second electrode of the first capacitor C1, and a second electrode of the first transistor T1 is configured to be connected to the reset control node H.

The reset sub-circuit 420 can be implemented as a second transistor T2 and a third transistor T3. A gate electrode of the second transistor T2 is configured to be connected to the reset sub-signal terminal RST to receive the reset sub-signal, a first electrode of the second transistor T2 is configured to be connected to the gate electrode of the first transistor T1, and a second electrode of the second transistor T2 is configured to be connected to the first voltage terminal VGL1 to receive the first voltage. A gate electrode of the third transistor T3 is configured to be connected to the reset sub-signal terminal RST to receive the reset sub-signal, a first electrode of the third transistor T3 is configured to be connected to the reset control node H, and a second electrode of the third transistor T3 is configured to be connected to the first voltage terminal VGL1.

In a case where the reset control signal supplied from the reset control signal terminal Con is changed from an invalid level which turns off the first transistor T1 to a valid level which turns on the first transistor T1 (for example, from a low level to a high level), due to an bootstrap effect of the first capacitor C1, a level of the second electrode of the first capacitor C1 is further raised and higher than a high level of the reference signal of the reference signal terminal Stan, and the raised level is referred to as a working level. The first transistor T1 is turned on under control of a high level of the reset control signal, and a working level of the second electrode of the first capacitor C1 charges the reset control node H such that the level of the reset control node H also reaches the working level. For example, the reference signal terminal Stan can be connected to any signal terminal and voltage terminal, as long as it can be ensured that a high level signal can be provided when needed, so that the level of the second electrode of the first capacitor C1 is further raised relative to the high level signal to reach the working level. In a case where the reset sub-signal provided by the reset sub-signal terminal RST is at a valid level (for example, a high level), the second transistor T2 and the third transistor T3 are both turned on, thereby resetting the gate electrode of the first transistor T1 and the reset control node H, respectively.

It should be noted that, in various embodiments of the present disclosure, the reset control circuit 400 may also be implemented as other circuit structures, and may further comprise more circuit components, and the embodiments of the present disclosure are not limited thereto. For example, in an example, as illustrated in FIG. 6, the reset control circuit 400 further comprises a third capacitor C3, a first electrode of the third capacitor C3 is configured to be connected to the gate electrode of the first transistor T1, and a second electrode of the third capacitor C3 is configured to be connected to the first voltage terminal VGL1. The third capacitor C3 can improve the isolation degree between the gate electrode of the first transistor T1 and the first voltage terminal VGL1, thereby facilitating better control of a gate voltage of the first transistor T1.

The input circuit 100 can be implemented as a fourth transistor T4. A gate electrode of the fourth transistor T4 is connected to a first electrode of the fourth transistor T4 and is configured to be connected to the input terminal INT to receive the input signal, and a second electrode of the fourth transistor T4 is configured to be connected to the pull-up node PU. In a case where the input signal of the input terminal INT is at a valid level (for example, a high level), the fourth transistor T4 is turned on, and the input signal charges the pull-up node PU, such that the pull-up node PU is at a high level.

For example, in an example, the output terminal OT of the output circuit 200 comprises at least one shift signal output terminal OC and at least one pixel signal output terminal OP, so as to improve the driving capability of the shift register unit 10. The shift signal output terminal OC is used to provide an input signal to other shift register unit 10 that is cascaded, and the pixel signal output terminal OP is used to provide a driving signal to a pixel circuit. For example, an output signal of the shift signal output terminal OC and an output signal of the pixel signal output terminal OP are the same.

The output circuit 200 can be implemented as a fifth transistor T5, a sixth transistor T6, and a second capacitor C2. A gate electrode of the fifth transistor T5 is configured to be connected to the pull-up node PU, a first electrode of the fifth transistor T5 is configured to be connected to the clock signal terminal CLK to receive the clock signal, and a second electrode of the fifth transistor T5 is configured to be connected to the shift signal output terminal OC. A gate electrode of the sixth transistor T6 is configured to con- nected to the pull-up node PU, a first electrode of the sixth transistor T6 is configured to be connected to the clock signal terminal CLK to receive the clock signal, and a second electrode of the sixth transistor T6 is configured to be connected to the pixel signal output terminal OP. A first electrode of the second capacitor C2 is configured to be connected to the pull-up node PU, and a second electrode of the second capacitor C2 is configured to be connected to the second electrode of the sixth transistor T6. Of course, the embodiments of the present disclosure are not limited thereto, and in another example, the second electrode of the second capacitor C2 may be connected to the second electrode of the fifth transistor T5. In a case where the pull-up node PU is at a valid level (such as a high level), the fifth transistor T5 and the sixth transistor T6 are both turned on, thereby outputting the clock signal of the clock signal terminal CLK to the shift signal output terminal OC and the pixel signal output terminal OP, respectively.

The first reset circuit 300 may be implemented as a seventh transistor T7. A gate electrode of the seventh transistor T7 is configured to be connected to the reset control node H, a first electrode of the seventh transistor T7 is configured to be connected to the pull-up node PU, and a second electrode of the seventh transistor T7 is configured to be connected to the first voltage terminal VGL1. In a case where the reset control node H is charged to be at a working level, the seventh transistor T7 is turned on, so as to electrically connect the pull-up node PU with the first voltage terminal VGL1, and therefore, the pull-up node PU can be reset.

For example, a channel current of the seventh transistor T7 is $Ids=k(Vg-Vth)^2$, where Vg is a gate voltage of the seventh transistor T7, and Vth is a threshold voltage (about 0V) of the seventh transistor T7. Therefore, the channel current Ids is approximately proportional to the square of the gate voltage Vg. Because the working level of the reset control node H is higher than the high level of the reference signal of the reference signal terminal Stan, that is, the working level of the reset control node H is higher than levels of other high level signals in the shift register unit 10, the gate voltage Vg of the seventh transistor T7 is increased, and the channel current Ids is correspondingly increased. The seventh transistor T7 can be fully turned on, thereby sufficiently performing noise reduction (reset) on the pull-up node PU, furthermore solving the problem of insufficient noise reduction of the pull-up node PU caused by a decrease in the channel current of a noise reduction transistor (the seventh transistor T7) in a low temperature environment, and avoiding the phenomenon of multi-output and ensuring the normal operation of the product.

The first control circuit 510 can be implemented as an eighth transistor T8 and a ninth transistor T9. A gate electrode of the eighth transistor T8 is configured to be connected to the first control node PD_CN1, a first electrode of the eighth transistor T8 is configured to be connected to the second voltage terminal VDDo, and a second electrode of the eighth transistor T8 is configured to be connected to the first pull-down node PD1. A gate electrode of the ninth transistor T9 is configured to be connected to the pull-up node PU, a first electrode of the ninth transistor T9 is configured to be connected to the first pull-down node PD1, and a second electrode of the ninth transistor T9 is configured to be connected to the first voltage terminal VGL1.

The second control circuit 520 can be implemented as a tenth transistor T10 and an eleventh transistor T11. A gate electrode of the tenth transistor T10 is configured to be connected to the second control node PD_CN2, a first electrode of the tenth transistor T10 is configured to be connected to the third voltage terminal VDDe, and a second electrode of the tenth transistor T10 is configured to be connected to the second pull-down node PD2. A gate electrode of the eleventh transistor T11 is configured to be connected to the pull-up node PU, a first electrode of the eleventh transistor T11 is configured to be connected to the second pull-down node PD2, and a second electrode of the eleventh transistor T11 is configured to be connected to the first voltage terminal VGL1.

The third control circuit 610 can be implemented as a twelfth transistor T12 and a thirteenth transistor T13. A gate electrode of the twelfth transistor T12 is connected to a first electrode of the twelfth transistor T12 and is configured to be connected to the second voltage terminal VDDo, and a second electrode of the twelfth transistor T12 is configured to be connected to the first control node PD_CN1. A gate electrode of the thirteenth transistor T13 is configured to be connected to the pull-up node PU, a first electrode of the thirteenth transistor T13 is configured to be connected to the first control node PD_CN1, and a second electrode of the thirteenth transistor T13 is configured to be connected to the first voltage terminal VGL1.

The fourth control circuit 620 can be implemented as a fourteenth transistor T14 and a fifteenth transistor T15. A gate electrode of the fourteenth transistor T14 is connected to a first electrode of the fourteenth transistor T14 and is configured to be connected to the third voltage terminal VDDe, and a second electrode of the fourteenth transistor T14 is configured to be connected to the second control node PD_CN2. A gate electrode of the fifteenth transistor T15 is configured to be connected to the pull-up node PU, a first electrode of the fifteenth transistor T15 is configured to be connected to the second control node PD_CN2, and a second electrode of the fifteenth transistor T15 is configured to be connected to the first voltage terminal VGL1.

The first node noise reduction circuit 700 can be implemented as a sixteenth transistor T16 and a seventeenth transistor T17. A gate electrode of the sixteenth transistor T16 is configured to be connected to the first pull-down node PD1, a first electrode of the sixteenth transistor T16 is configured to be connected to the pull-up node PU, and a second electrode of the sixteenth transistor T16 is configured to be connected to the first voltage terminal VGL1. A gate electrode of the seventeenth transistor T17 is configured to be connected to the second pull-down node PD2, a first electrode of the seventeenth transistor T17 is configured to be connected to the pull-up node PU, and a second electrode of the seventeenth transistor T17 is configured to be connected to the first voltage terminal VGL1. In a case where the first pull-down node PD1 is at a valid level (for example, a high level), the sixteenth transistor T16 is turned on, to electrically connect the pull-up node PU with the first voltage terminal VGL1, so that the pull-up node PU can be pulled down to achieve noise reduction. In a case where the second pull-down node PD2 is at a valid level (for example, a high level), the seventeenth transistor T17 is turned on, and the noise reduction can also be performed on the pull-up node PU.

The output noise reduction circuit 800 can be implemented as an eighteenth transistor T18, a nineteenth transistor T19, a twentieth transistor T20, and a twenty-first transistor T21. A gate electrode of the eighteenth transistor T18 is configured to be connected to the first pull-down node PD1, a first electrode of the eighteenth transistor T18 is configured to be connected to the shift signal output terminal OC, and a second electrode of the eighteenth transistor T18 is configured to be connected to the first voltage terminal VGL1. A gate electrode of the nineteenth transistor T19 is configured to be connected to the second pull-down node PD2, a first electrode of the nineteenth transistor T19 is configured to be connected to the shift signal output terminal OC, and a second electrode of the nineteenth transistor T19 is configured to be connected to the first voltage terminal VGL1. A gate electrode of the twentieth transistor T20 is configured to be connected to the first pull-down node PD1, a first electrode of the twentieth transistor T20 is configured to be connected to the pixel signal output terminal OP, and a second electrode of the twentieth transistor T20 is configured to be connected to a fourth voltage terminal VGL2 to receive a fourth voltage. A gate electrode of the twenty-first transistor T21 is configured to be connected to the second pull-down node PD2, a first electrode of the twenty-first transistor T21 is configured to be connected to the pixel signal output terminal OP, and a second electrode of the twenty-first transistor T21 is configured to be connected to the fourth voltage terminal VGL2.

For example, the fourth voltage terminal VGL2 is configured to maintain to input a DC low level signal, the DC low level signal is referred to as a fourth voltage, and the following embodiments are the same as those described herein and are not described again. For example, the fourth voltage terminal VGL2 may also be connected to the first voltage terminal VGL1, and the first voltage serves as the fourth voltage. In a case where the first pull-down node PD1 is at a valid level (for example, a high level), the eighteenth transistor T18 is turned on to electrically connect the shift signal output terminal OC with the first voltage terminal VGL1, and therefore, the shift signal output terminal OC can be pulled down, so as to achieve noise reduction; the twentieth transistor T20 is also turned on to electrically connect the pixel signal output terminal OP with the fourth voltage terminal VGL2, so that the pixel signal output terminal OP can be pulled down, so as to achieve noise reduction. In a case where the second pull-down node PD2 is at a valid level (such as a high level), the nineteenth transistor T19 and the twenty-first transistor T21 are turned on, and the noise reduction can also be performed on the shift signal output terminal OC and the pixel signal output terminal OP.

The second reset circuit 900 may be implemented as a twenty-second transistor T22. A gate electrode of the twenty-second transistor T22 is configured to be connected to the second reset terminal Re2 to receive the second reset signal, a first electrode of the twenty-second transistor T22 is configured to be connected to the pull-up node PU, and a second electrode of the twenty-second transistor T22 is configured to be connected to the first voltage terminal VGL1. In a case where the second reset signal of the second reset terminal Re2 is at a valid level (for example, a high level), the twenty-second transistor T22 is turned on to electrically connect the pull-up node PU with the first voltage terminal VGL1, thereby resetting the pull-up node PU.

It should be noted that, in the various embodiments of the present disclosure, the first capacitor C1, the second capacitor C2, and the third capacitor C3 can be capacitor devices manufactured by a process, for example, by fabricating special capacitor electrodes to implement the capacitor device, and respective electrodes of the capacitor can be implemented by a metal layer, a semiconductor layer (for example, doped polysilicon), or the like. Moreover, the first capacitor C1, the second capacitor C2, and the third capacitor C3 may also be parasitic capacitors between transistors, and can be implemented by the transistors and other devices and wires.

Figure 7:
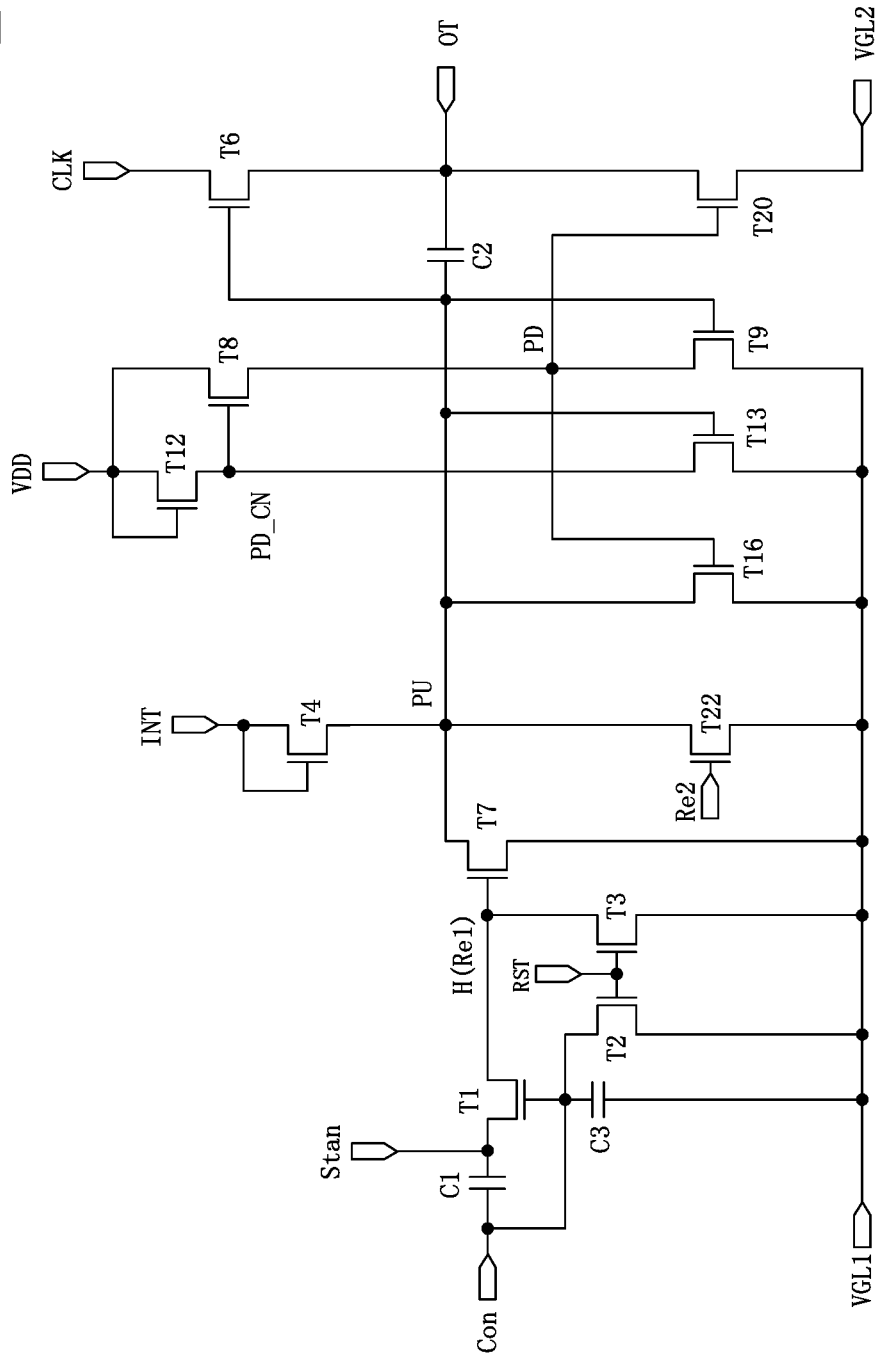
FIG. 7 is a circuit diagram of a specific implementation example of the shift register unit illustrated in FIG. 5.

FIG. 7 is a circuit diagram of a specific implementation example of the shift register unit illustrated in FIG. 5. The shift register unit 10 comprises the fifth control circuit 500 and the sixth control circuit 600. The specific implementations of the fifth control circuit 500 and the sixth control circuit 600 can refer to the specific implementations of the first control circuit 510 and the third control circuit 610 of the shift register unit 10 illustrated in FIG. 6, and details are not described herein again. Correspondingly, the shift register unit 10 comprises the fourth node PD and the third control node PD_CN. The first node noise reduction circuit 700 can be implemented as a sixteenth transistor T16, and the output noise reduction circuit 800 can be implemented as a twentieth transistor T20. The connection mode of the respective transistors of the shift register unit 10 is similar to that of the shift register unit 10 illustrated in FIG. 6, and details are not described here again. In this example, the output circuit 200 comprises an output terminal OT, and the output terminal OT is used to provide input signals to other shift register units 10 that are cascaded and to provide driving signals for the pixel circuits as well.

It should be noted that, in the description of various embodiments of the present disclosure, the reset control node H, the pull-up node PU, the first pull-down node PD1, the second pull-down node PD2, the fourth node PD, the first control node PD_CN1, the second control node PD_CN2, and the third control node PD_CN do not represent the actual components, but represent the junctions of the associated electrical connections in the circuit diagram.

It should be noted that, transistors used in the embodiments of the present disclosure may be thin film transistors, field effect transistors, or other switch elements with the same characteristics, and the embodiments of the present disclosure are described by taking the thin film transistors as an example. A source electrode and a drain electrode of the transistor used herein may be symmetrical in structures, and therefore the source electrode and the drain electrode of the transistor may be indistinguishable in structures. In the embodiments of the present disclosure, in order to distinguish two electrodes of the transistor except the gate electrode of the transistor, one of the two electrodes is directly described as a first electrode, and the other of the two electrodes is described as a second electrode.

In addition, the transistors in the embodiments of the present disclosure are all described by taking N-type transistors as an example, and in this case, the first electrode of the transistor is the drain electrode, and the second electrode is the source electrode. It should be noted that, the present disclosure comprises but is not limited thereto. For example, one or more transistors in the shift register unit 10 provided by the embodiments of the present disclosure may also adopt P-type transistors, so long as the respective electrodes of the selected type transistor are connected correspondingly with reference to the connection manner of the respective electrodes of the corresponding transistor in the embodiments of the present disclosure, and the corresponding voltage terminal and signal terminal are provided with corresponding high voltages or low voltages. In this case, the first electrode of the transistor is the source transistor, and the second electrode is the drain electrode. For example, in a case where the embodiments of the present disclosure are implemented by P-type transistors, the signals or voltage polarities are accordingly adjusted, and moreover, in this case, the terms "pull-up" and "pull-down" also respectively cover the cases where absolute values of the respective levels decrease or raise to achieve the same operations (for example, turn-on or turn-off) of the transistors. In a case where the N-type transistor is adopted, indium gallium zinc oxide (IGZO) may be used as an active layer of the thin film transistor, compared with low temperature poly silicon (LTPS) or amorphous silicon (for example, hydrogenation amorphous silicon) used as the active layer of the thin film transistor, the size of the transistor can be effectively reduced and the leakage current can be prevented.

Figure 8A:
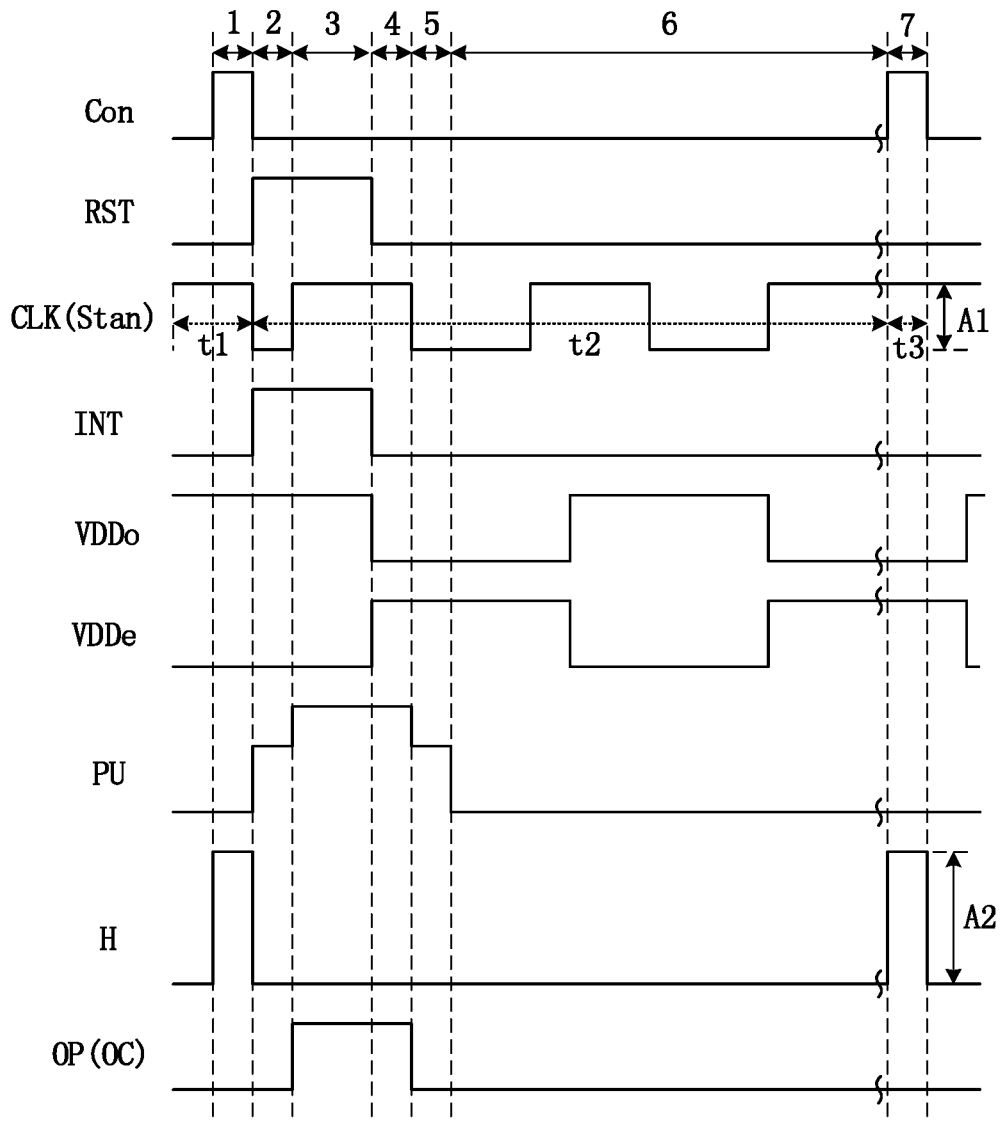
FIG. 8A is a signal timing diagram of a shift register unit provided by some embodiments of the present disclosure.

FIG. 8A is a signal timing diagram of a shift register unit provided by some embodiments of the present disclosure. The working principle of the shift register unit 10 illustrated in FIG. 6 is described below with reference to the signal timing diagram illustrated in FIG. 8A, and here, the description are made by taking a case where the respective transistors are N-type transistors as an example, but the embodiments of the present disclosure are not limited thereto.

In FIG. 8A and the descriptions below, Con, RST, CLK, Stan, INT, VDDo, VDDe, OP, OC, and the like are used to indicate the corresponding signal terminals and to indicate the corresponding signals as well, and the following embodiments are the same as those described herein and are not described again. In first to seventh phases 1-7 illustrated in FIG. 8A, the shift register unit 10 can perform following operations, respectively.

Figure 8B:
FIG. 8B is a timing diagram of a reset control node of a shift register unit provided by some embodiments of the present disclosure.

In a first phase 1, the reset control signal terminal Con provides a high level signal, and the first transistor T1 is turned on. The reference signal terminal Stan is connected to the clock signal terminal CLK, the clock signal serves as the reference signal, and in this case, the reference signal is at a high level. Due to the bootstrap effect of the first capacitor C1, the level of the second electrode of the first capacitor C1 is raised to the working level and the reset control node H is charged to enable the level of the reset control node H to be the working level. An amplitude A2 of the working level is larger than an amplitude A1 of the reference signal (that is, the working level is higher than the level of the reference signal), and a relationship between A2 and A1 is illustrated in FIG. 8B. The seventh transistor T7 is sufficiently turned on under control of the working level of the reset control node H, thereby resetting the pull-up node PU. The second voltage terminal VDDo provides a high level signal, and the twelfth transistor T12 is turned on to enable the first control node PD_CN to be at a high level. The eighth transistor T8 is turned on, so that the first pull-down node PD1 is at a high level, thereby controlling the sixteenth transistor T16, the eighteenth transistor T18, and the twentieth transistor T20 to be turned on, and thus respectively performing noise reduction on the pull-up node PU, the shift signal output terminal OC, and the pixel signal output terminal OP. In this case, the second pull-down node PD2 is at a low level.

In a second phase 2, the reset sub-signal terminal RST provides a high level signal, and the second transistor T2 and the third transistor T3 are turned on, thereby resetting the gate electrode of the first transistor T1 and the reset control node H, and enabling the first transistor T1 and the seventh transistor T7 to be turned off. The input terminal INT provides a high level signal, the fourth transistor T4 is turned on, and the pull-up node PU is charged to a first level (high level). The fifth transistor T5 and the sixth transistor T6 are turned on, and the clock signal of the clock signal terminal CLK are respectively output to the shift signal output terminal OC and the pixel signal output terminal OP. In this case, the clock signal is at a low level, and therefore, the shift signal output terminal OC and the pixel signal output terminal OP output low levels. The thirteenth transistor T13 and the ninth transistor T9 are both turned on. Because the twelfth transistor T12 and the thirteenth transistor T13 are connected in series to divide voltage, the first control node PD_CN1 is pulled down to a low level. The eighth transistor T8 is turned off, and the first pull-down node PD1 is pulled down to a low level by the turned-on ninth transistor T9. The sixteenth transistor T16, the eighteenth transistor T18, and the twentieth transistor T20 are all turned off.

In a third phase 3, the reset sub-signal terminal RST continues to provide the high level signal, and the second transistor T2 and the third transistor T3 remain to be turned on, so as to enable the first transistor T1 and the seventh transistor T7 to remain to be turned off. The clock signal of the clock signal terminal CLK becomes a high level, the potential of the pull-up node PU is further increased due to the coupling effect of the clock signal, the fifth transistor T5 and the sixth transistor T6 are sufficiently turned on, and the high level of the clock signal is output to the shift signal output terminal OC and the pixel signal output terminal OP. The first pull-down node PD1 is kept at a low level, and the sixteenth transistor T16, the eighteenth transistor T18, and the twentieth transistor T20 are kept to be turned off, thereby not affecting the output.

In a fourth phase 4, the third voltage terminal VDDe provides a high level signal, and the second voltage terminal VDDo provides a low level signal. The fifteenth transistor T15 and the eleventh transistor Ti1 are both turned on under control of the high level of the pull-up node PU. The fourteenth transistor T14 is turned on. Because the fourteenth transistor T14 and the fifteenth transistor T15 are connected in series to divide voltage, the second control node PD_CN2 is at a low level. The tenth transistor T10 is turned off, and the second pull-down node PD2 is at a low level under control of the turned-on eleventh transistor Ti1. The seventeenth transistor T17, the nineteenth transistor T19, and the twenty-first transistor T21 are all turned off. At this time, the first pull-down node PD1 is kept at a low level.

In a fifth phase 5, the clock signal of the clock signal terminal CLK becomes a low level, and the potential of the pull-up node PU is reduced due to the coupling effect of the clock signal, but is still at a high level, the fifth transistor T5 and the sixth transistor T6 remain to be turned on, and the low level of the clock signal is output to the shift signal output terminal OC and the pixel signal output terminal OP.

In a sixth phase 6, the second reset terminal Re2 provides a high level signal (not illustrated in FIG. 8A), and the twenty-second transistor T22 is turned on, thereby pulling down the level of the pull-up node PU to a low level. The eleventh transistor T11 and the fifteenth transistor T15 are turned off. At an initial moment of the sixth phase 6, the third voltage terminal VDDe provides a high level signal, the second control node PD_CN2 is pulled up to a high level by the fourteenth transistor T14, and the tenth transistor T10 is turned on to pull up the second pull-down node PD2 to a high level. The seventeenth transistor T17, the nineteenth transistor T19, and the twenty-first transistor T21 are both turned on to perform noise reduction on the pull-up node PU, the shift signal output terminal OC, and the pixel signal output terminal OP, respectively. In the sixth phase 6, the second voltage terminal VDDo and the third voltage terminal VDDe alternately provide a high level signal, so that the first pull-down node PD1 and the second pull-down node PD2 are alternately at a high level, thereby continuously performing noise reduction on the pull-up node PU, the shift signal output terminal OC, and the pixel signal output terminal OP.

In a seventh phase 7, the reset control signal terminal Con provides a high level signal, and the first transistor T1 is turned on. The reference signal (clock signal) provides a continuous high level signal. Due to the bootstrap effect of the first capacitor C1, the level of the second electrode of the first capacitor C1 is raised to the working level and the reset control node H is charged to enable the level of the reset control node H to be the working level. The amplitude A2 of the working level is larger than the amplitude A1 of the reference signal (that is, the working level is higher than the level of the reference signal). The seventh transistor T7 is sufficiently turned on under control of the working level of the reset control node H to reset (perform noise reduction on) the pull-up node PU.

For example, the first phase 1 is a phase before the scanning of one frame of image starts, and the seventh phase 7 is a phase after the scanning of one frame of image ends. In the various embodiments of the present disclosure, the reset control signal terminal Con provides a high level signal in both the first phase 1 and the seventh phase 7, so that the pull-up node PU is sufficiently reset (noise reduction) before the scanning of one frame of image starts and after the scanning of one frame of image ends; or, the reset control signal terminal Con can also provide a high level signal only in the seventh phase 7, so that the pull-up node PU is sufficiently reset (noise reduction) only after the scanning of one frame of image ends. For example, in a case where the clock signal of the clock signal terminal CLK serves as the reference signal of the reference signal terminal Stan, in a scanning period t2 of one frame of image, the clock signal is set to be a periodic pulse; in remaining periods (for example, a period t1 before the scanning of one frame of image starts and a period t3 after the scanning of one frame of image ends), the clock signal is kept to be a DC signal (such as a high level signal), to facilitate raising the level of the second electrode of the first capacitor C1 in the first phase 1 and in the seventh phase 7.

It should be noted that, in the respective embodiments of the present disclosure, in a case where the respective transistors are P-type transistors and the valid level for controlling the transistors to be turned on is a low level (the low level is greater than 0V), the clock signal needs to be kept to be a low level signal in the period t1 before the scanning of one frame of image starts and in the period t3 after the scanning of one frame of image ends, so as to facilitate pulling down the level of the second electrode of the first capacitor C1 in the first phase 1 and in the seventh phase 7, so that the level is lower than the low level of the clock signal.

At least one embodiment of the present disclosure further provides a gate drive circuit. The gate drive circuit comprises the shift register unit according to any one of the embodiments of the present disclosure. The gate drive circuit can perform sufficient noise reduction on a first node (such as a pull-up node), solve the problem of insufficient noise reduction of the first node caused by a decrease in a channel current of a noise reduction transistor in a low temperature environment, thereby avoiding the phenomenon of multi-output and ensuring the normal operation of the product.

Figure 9:
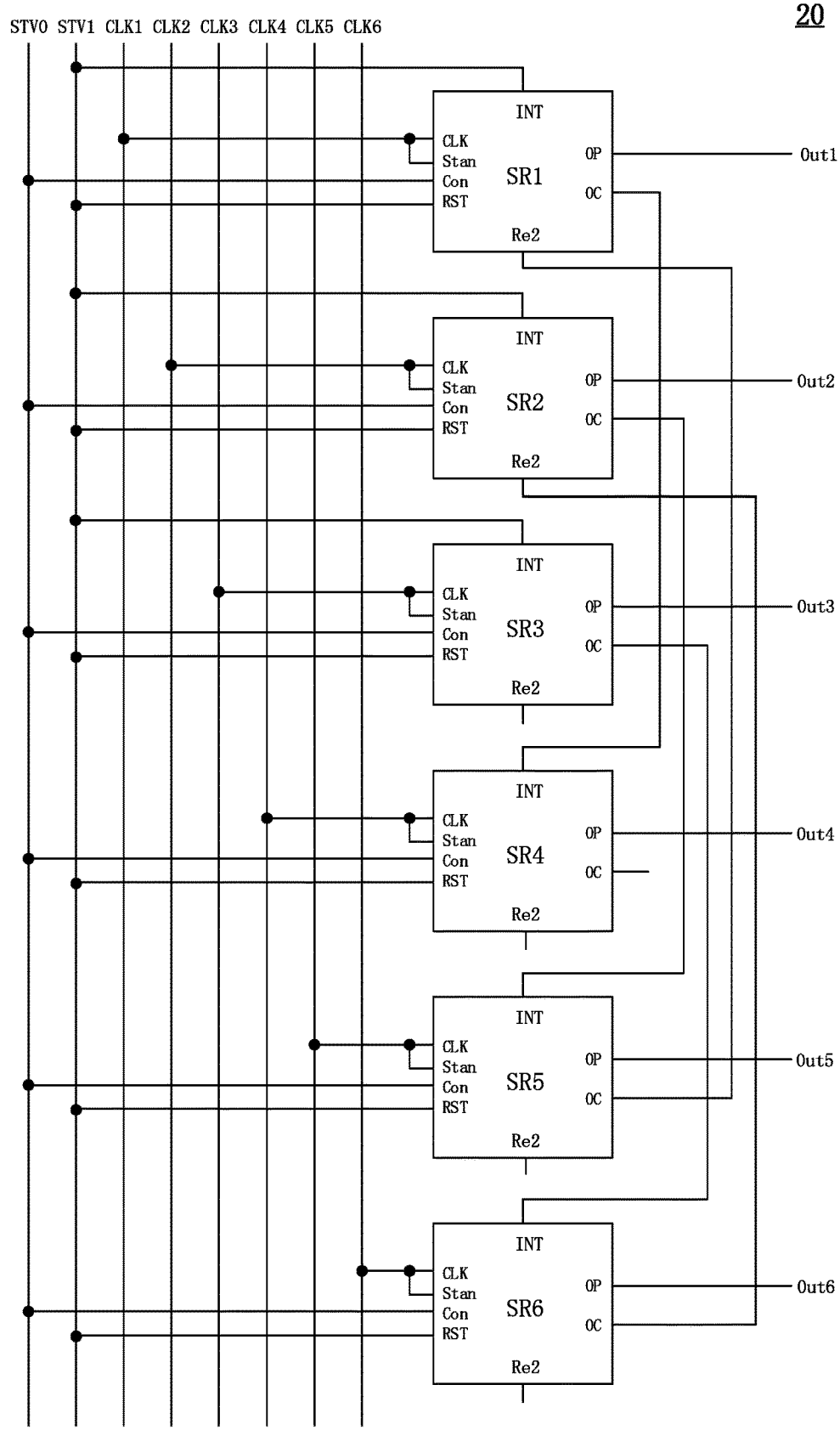
FIG. 9 is a schematic block diagram of a gate drive circuit provided by some embodiments of the present disclosure.

FIG. 9 is a schematic block diagram of a gate drive circuit provided by some embodiments of the present disclosure. Referring to FIG. 9, a gate drive circuit 20 comprises a plurality of shift register units (SR1-SR6, etc.) that are cascaded. The number of the plurality of shift register units is not limited and can be determined according to actual needs. For example, the shift register unit can adopt the shift register unit 10 according to any one of the embodiments of the present disclosure. For example, in the gate drive circuit 20, part or all of the shift register units may adopt the shift register unit 10 provided by any one of the embodiments of the present disclosure. For example, the gate drive circuit 20 can be directly integrated on an array substrate of a display device by a process similar to that of a thin film transistor, thereby achieving a progressive scan driving function.

For example, each shift register unit has an input terminal INT, a clock signal terminal CLK, a reference signal terminal Stan, a reset control signal terminal Con, a reset sub-signal terminal RST, a second reset terminal Re2, a shift signal output terminal OC, a pixel signal output terminal OP, and the like. For example, the reference signal terminal Stan and the clock signal terminal CLK of each shift register unit are connected with each other. For example, except for the first to third shift register units, an input terminal INT of an sth shift register unit is connected to a shift signal output terminal OC of a (s−3)th shift register unit, and s is an integer greater than three. For example, except for the last four shift register units, a second reset terminal Re2 of a mth shift register unit is connected to a shift signal output terminal OC of a (m+4)th shift register unit, and m is an integer greater than 0. For example, input terminals INT of the first to third shift register units are connected to a trigger signal line STV1. For example, second reset terminals Re2 of the last four shift register units are connected to a separately provided reset signal line. For example, the reset control signal terminal Con of each shift register unit is connected to a reset control signal line STV0, and the reset sub-signal terminal RST of each shift register unit is connected to the trigger signal line STV1. The pixel signal output terminal OP of each shift register unit is connected to pixel units of a corresponding row to output a driving signal to the pixel units in this row.

For example, the gate drive circuit 20 further comprises a first clock signal line CLK1, a second clock signal line CLK2, a third clock signal line CLK3, a fourth clock signal line CLK4, a fifth clock signal line CLK5, and a sixth clock signal line CLK6. The connection method between each shift register unit and the above-mentioned respective clock signal lines is described below and so on.

A clock signal terminal CLK of a (6n−5)th shift register unit (for example, the first shift register unit SR1 in the drawing) is connected to the first clock signal line CLK1, a clock signal terminal CLK of a (6n−4)th shift register unit (for example, the second shift register unit SR2 in the drawing) is connected to the second clock signal line CLK2, a clock signal terminal CLK of a (6n−3)th shift register unit (for example, the third shift register unit SR3 in the drawing) is connected to the third clock signal line CLK3, a clock signal terminal CLK of a (6n−2)th shift register unit (for example, the fourth shift register unit SR4 in the drawing) is connected to the fourth clock signal line CLK4, a clock signal terminal CLK of a (6n−1)th shift register unit (for example, the fifth shift register unit SR5 in the drawing) is connected to the fifth clock signal line CLK5, and a clock signal terminal CLK of a (6n)th shift register unit (for example, the sixth shift register unit SR6 in the drawing) is connected to the sixth clock signal line CLK6. Here, n is an integer greater than 0.

For example, the gate drive circuit 20 further comprises a timing controller T-CON, for example, the timing controller T-CON is configured to provide the respective clock signals to the respective shift register units, and the timing controller T-CON can also be configured to provide the reset control signal, the reset sub-signal, and the like. It should be noted that, a phase relationship among the plurality of clock signals provided by the timing controller T-CON can be determined according to actual needs. In different examples, according to different configurations, more or fewer clock signals may be provided. For example, the gate drive circuit 20 may comprise a plurality of voltage lines to provide a plurality of voltage signals to the respective shift register units.

For example, in a case where the gate drive circuit 20 is used to drive a display panel, the gate drive circuit 20 can be disposed on one side of the display panel. For example, the display panel comprises a plurality of rows of gate lines, and the pixel signal output terminals OP of the respective shift register units in the gate drive circuit 20 may be configured to be sequentially connected to the plurality of rows of gate lines for outputting the driving signals. Certainly, the gate drive circuits 20 may also be disposed on both sides of the display panel to implement bilateral driving, and the embodiments of the present disclosure do not limit the setting mode of the gate drive circuit 20. For example, a gate drive circuit 20 may be disposed on one side of the display panel for driving odd-numbered gate lines, and another gate drive circuit 20 may be disposed on the other side of the display panel for driving even-numbered gate lines.

Figure 10:
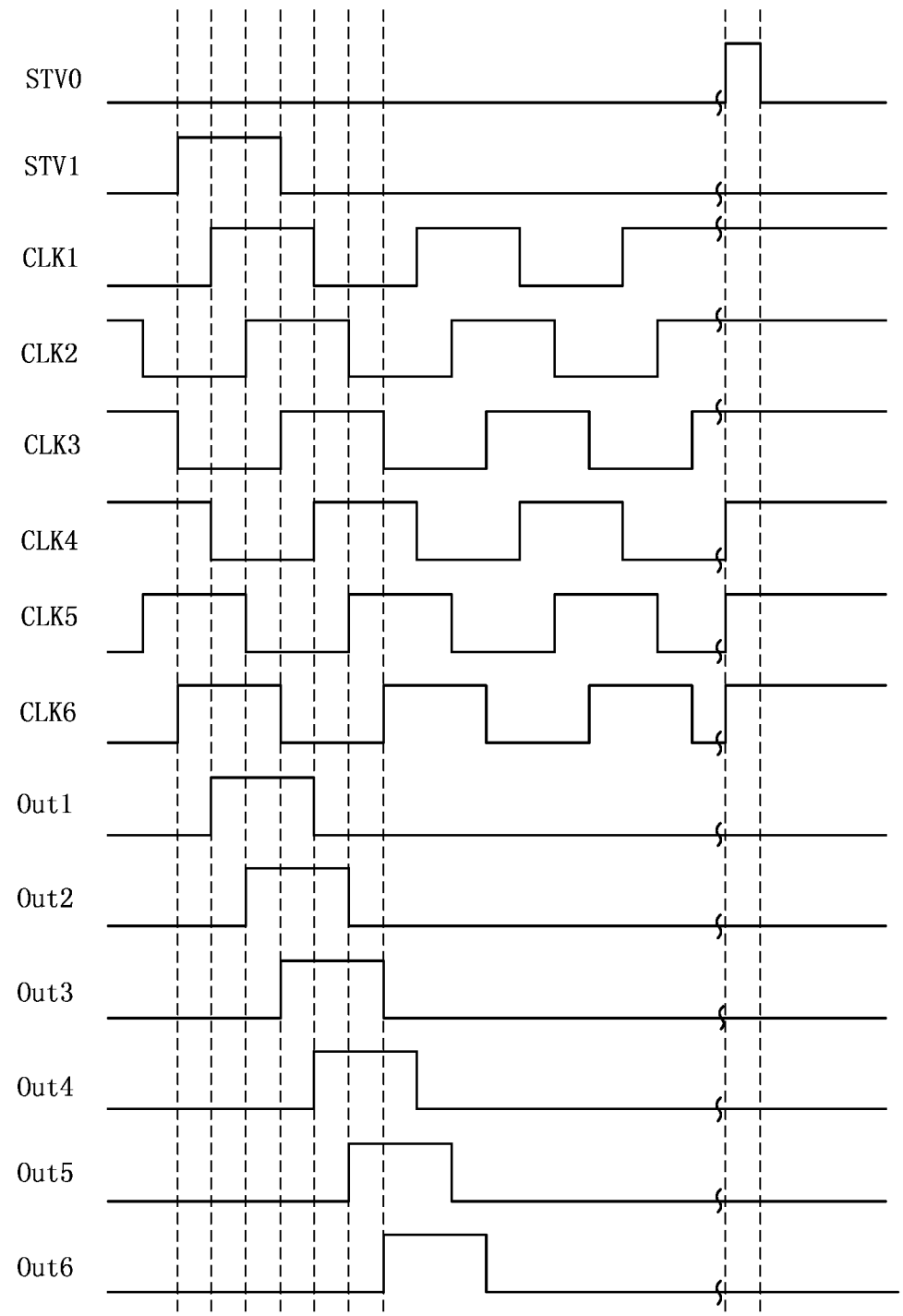
FIG. 10 is a signal timing diagram of a gate drive circuit provided by some embodiments of the present disclosure.

FIG. 10 is a signal timing diagram of a gate drive circuit provided by some embodiments of the present disclosure, the signal timing diagram is the timing of the gate drive circuit 20 as illustrated in FIG. 9, and the shift register unit in the gate drive circuit 20 is the shift register unit 10 as illustrated in FIG. 6. The working principle of the gate drive circuit 20 can be referred to the corresponding description of the shift register unit 10 in the embodiments of the present disclosure, and details are not described herein again.

The gate drive circuit 20 outputs line by line in one frame of image until outputting a signal corresponding to the last line, thereby completing the display of one frame of image. After the scanning of one frame of image ends, the reset control signal line STV0 provides a high level signal, thereby sufficiently resetting (performing noise reduction on) the pull-up node PU of each shift register unit. The first to sixth clock signal lines CLK1-CLK6 provide periodic pulses during the scanning of one frame of image, and the phases of the respective clock signals are sequentially delayed by ⅓ of the effective pulse width. The first to sixth clock signal lines CLK1-CLK6 provide high level signals after the scanning of one frame of image ends, so that the level of the second electrode of the first capacitor C1 is further raised relative to the high level signal, to reach the working level. The waveforms of the output signals Out1-Out6 of the pixel signal output terminals OP of the first to sixth shift register units SR1-SR6 are sequentially overlapped by ⅓ of the effective pulse width. The output signals Out1-Out6 of the gate drive circuit 20 overlap, so that the pre-charging function can be achieved, and the charging time of the pixel circuit can be shortened, thereby facilitating achieving high refresh rate.

It should be noted that, in the various embodiments of the present disclosure, the gate drive circuit 20 is not limited to the cascading mode illustrated in FIG. 9, and may adopt any applicable cascading modes. In a case where the cascading mode or the clock signal is changed, the waveform overlapping portions of the output signals Out1-Out6 of the pixel signal output terminals OP of the first to sixth shift register units SR1-SR6 also change accordingly, so as to meet various application requirements.

At least one embodiment of the present disclosure further provides a display device. The display device comprises the gate drive circuit according to any one of the embodiments of the present disclosure. The gate drive circuit of the display device can sufficiently perform noise reduction on a first node (such as a pull-up node), solve the problem of insufficient noise reduction of the first node caused by a decrease in a channel current of a noise reduction transistor in a low temperature environment, thereby avoiding the phenomenon of multi-output and ensuring the normal operation of the product.

Figure 11:
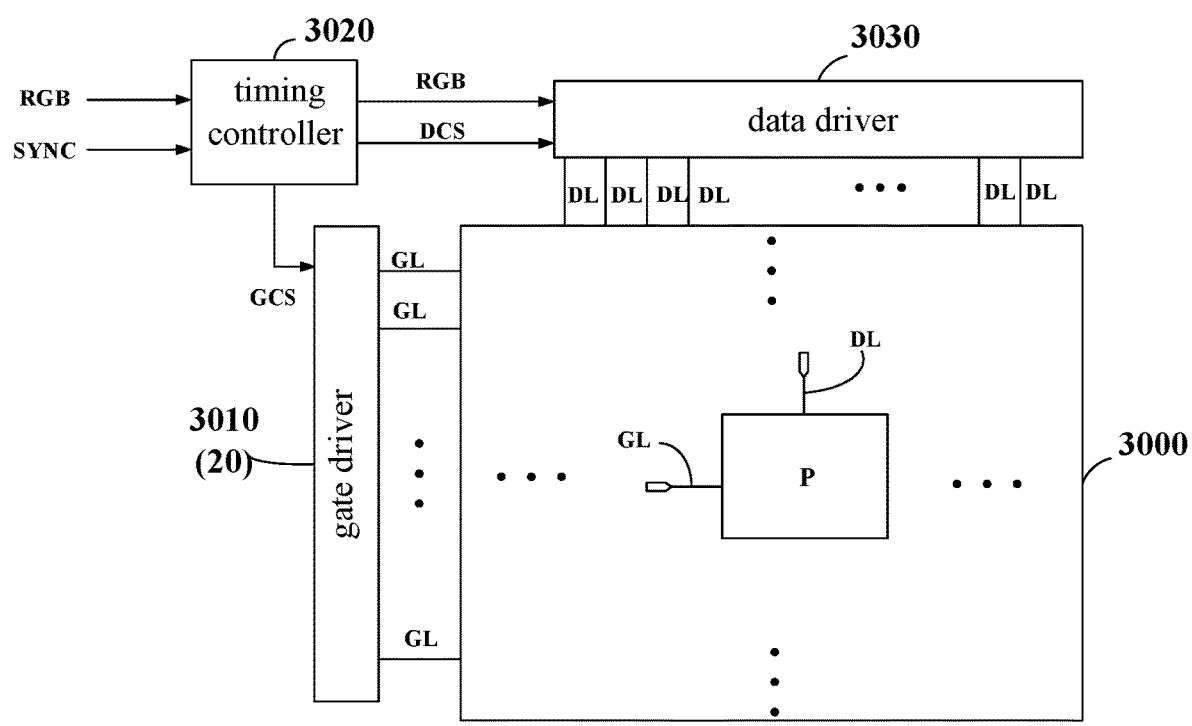
FIG. 11 is a schematic block diagram of a display device provided by some embodiments of the present disclosure.

FIG. 11 is a schematic block diagram of a display device provided by some embodiments of the present disclosure. Referring to FIG. 11, a display device 30 comprises a gate drive circuit 20, and the gate drive circuit 20 is the gate drive circuit according to any one of the embodiments of the present disclosure. For example, the display device 30 may be any product or component having a display function such as a liquid crystal display panel, a liquid crystal television, a monitor, an organic light-emitting diode (OLED) panel, an OLED television, an electronic paper display panel, a mobile phone, a tablet computer, a notebook computer, a digital photo frame, a navigation device, or the like, and the embodiments of the present disclosure are not limited thereto. For the technical effects of the display device 30, reference may be made to the corresponding descriptions of the shift register unit 10 and the gate drive circuit 20 in the above embodiments, and details are not described herein again.

For example, in an example, the display device 30 comprises a display panel 3000, a gate diver 3010, a timing controller 3020, and a data driver 3030. The display panel 3000 comprises a plurality of pixel units P defined according to a plurality of scanning lines GL and a plurality of data lines DL; the gate diver 3010 is configured to drive the plurality of scanning lines GL, the data driver 3030 is configured to drive the plurality of data lines DL, and the timing controller 3020 is configured to process image data RGB input from the outside of the display device 30, provide the processed image data RGB to the data driver 3030, and output scanning control signals GCS and data control signals DCS to the gate driver 3010 and the data driver 3030, so as to control the gate driver 3010 and the data driver 3030.

For example, the gate driver 3010 comprises the gate drive circuit 20 provided by any one of the embodiments of the present disclosure. The pixel signal output terminals OP of the plurality of shift register units 10 in the gate drive circuit 20 are correspondingly connected to the plurality of scanning lines GL. The plurality of scanning lines GL are connected to the pixel units P arranged in a plurality of rows. The pixel signal output terminals OP of the plurality of shift register units 10 in the gate drive circuit 20 sequentially output signals to the plurality of scanning lines GL, so as to achieve progressive scanning of the plurality of rows of the pixel units in the display panel 3000. For example, the gate driver 3010 may be implemented as a semiconductor chip or may be integrated in the display panel 3000 to form a GOA circuit.

For example, the data driver 3030 converts the digital image data RGB input from the timing controller 3020 into display data signals according to a plurality of data control signals DCS derived from the timing controller 3020 by using reference gamma voltages. The data driver 3030 provides the converted data signals to the plurality of data lines DL. For example, the data driver 3030 may be implemented as a semiconductor chip.

For example, the timing controller 3020 processes the image data RGB input from the outside to match the size and resolution of the display panel 3000, and then supplies the processed image data to the data driver 3030. The timing controller 3020 generates the plurality of scanning control signals GCS and the plurality of data control signals DCS by using synchronization signals (for example, a dot clock DCLK, a data enable signal DE, a horizontal synchronization signal Hsync, and a vertical synchronization signal Vsync) input from the outside of the display device 30. The timing controller 3020 respectively provides the generated scanning control signals GCS and data control signals DCS to the gate driver 3010 and the data driver 3030 for controlling the gate driver 3010 and the data driver 3030.

The display device 30 may also include other components, such as signal decoding circuits, voltage conversion circuits, etc., these components may be, for example, conventional components, and may not be described in detail herein.

At least one embodiment of the present disclosure further provides a method of driving a shift register unit, and the method can be used to drive the shift register unit 10 according to any one of the embodiments of the present disclosure. The noise reduction can be sufficiently performed on a first node (such as a pull-up node) by using the method, so as to solve the problem of insufficient noise reduction of the first node caused by a decrease in a channel current of a noise reduction transistor in a low temperature environment, thereby avoiding the phenomenon of multi-output and ensuring the normal operation of the product.

For example, in an example, the method of driving the shift register unit 10 comprises following operations.

In an input phase (that is, the second phase 2 mentioned above), the input circuit 100 controls the level of the first node (for example, the pull-up node PU) to a first level, and the output circuit 200 outputs a second level of the clock signal to the output terminal OT.

In an output phase (that is, the third phase 3 and the fourth phase 4 mentioned above), the output circuit 200 outputs a third level of the clock signal to the output terminal OT.

In a first reset phase (that is, the first phase 1 or the seventh phase 7 mentioned above), the reset control circuit 400 inputs the first reset signal Re1 to the first reset circuit 300 in response to the reset control signal and the reference signal, to turn on the first reset circuit 300 and to enable the first reset circuit 300 to reset the pull-up node PU.

For example, the second level is a low level, and the third level is a high level. For example, the first level is a high level, and the first level may be the same as or different from the third level.

For example, in an example, the clock signal and the reference signal may be the same signal, are periodic pulses in the input phase and in the output phase, and are DC signals (for example, high level signals or low level signals) in the first reset phase.

It should be noted that, the detail description of the method and the technical effects can be referred to the corresponding descriptions of the shift register unit 10 and the gate drive circuit 20 in the embodiments of the present disclosure, and details are not described herein again.

The following statements should be noted.

(1) The accompanying drawings involve only the structure(s) in connection with the embodiment(s) of the present disclosure, and other structure(s) can be referred to common design(s).

(2) In case of no conflict, the embodiments of the present disclosure and the features in the embodiment(s) can be combined with each other to obtain new embodiment(s).

What have been described above are only specific implementations of the present disclosure, the protection scope of the present disclosure is not limited thereto, and the protection scope of the present disclosure should be based on the protection scope of the claims.

What is claimed is:

1. A shift register unit, comprising an input circuit, an output circuit, a first reset circuit, and a reset control circuit,
wherein the input circuit is connected to a first node, and the input circuit is configured to control a level of the first node in response to an input signal;
the output circuit is connected to the first node and an output terminal, and the output circuit is configured to output a clock signal to the output terminal under control of the level of the first node;
the first reset circuit is connected to the first node, and the first reset circuit is configured to reset the first node in response to a first reset signal; and
the reset control circuit is connected to the first reset circuit, the reset control circuit is configured to, in response to a reset control signal and a reference signal, input the first reset signal to the first reset circuit to turn on the first reset circuit, and the reset control circuit is further configured to enable an amplitude of a level of the first reset signal to be larger than an amplitude of a level of the reference signal,
wherein the reset control circuit comprises:
a drive sub-circuit, connected to a reset control node, and configured to adjust a level of the reset control node according to the reset control signal and the reference signal, and the level of the reset control node is used as the first reset signal; and
a reset sub-circuit, connected to the reset control node, and configured to reset the reset control node and the drive sub-circuit in response to a reset sub-signal,
wherein the drive sub-circuit comprises a first capacitor and a first transistor, a first electrode of the first capacitor is connected to a reset control signal terminal to receive the reset control signal, a second electrode of the first capacitor is connected to a reference signal terminal to receive the reference signal, a gate electrode of the first transistor is connected to the first electrode of the first capacitor, a first electrode of the first transistor is connected to the second electrode of the first capacitor, and a second electrode of the first transistor is connected to the reset control node; and
the reset sub-circuit comprises a second transistor and a third transistor, a gate electrode of the second transistor is connected to a reset sub-signal terminal to receive the reset sub-signal, a first electrode of the second transistor is connected to the gate electrode of the first transistor, a second electrode of the second transistor is connected to a first voltage terminal to receive a first voltage, a gate electrode of the third transistor is connected to the reset sub-signal terminal to receive the reset sub-signal, a first electrode of the third transistor is connected to the reset control node, and a second electrode of the third transistor is connected to the first voltage terminal.

2. The shift register unit according to claim 1, wherein the reference signal terminal is connected to a clock signal terminal to receive the clock signal as the reference signal.

3. The shift register unit according to claim 1, further comprising a first control circuit, a second control circuit, a third control circuit, a fourth control circuit, a first node noise reduction circuit, and an output noise reduction circuit, wherein the first control circuit is connected to a second node, the first node, and a first control node, and the first control circuit is configured to control a level of the second node under control of the level of the first node and a level of the first control node;
the second control circuit is connected to a third node, the first node, and a second control node, and the second control circuit is configured to control a level of the third node under control of the level of the first node and a level of the second control node;
the third control circuit is connected to the first control node and the first node, and the third control circuit is configured to control the level of the first control node under control of the level of the first node;
the fourth control circuit is connected to the second control node and the first node, and the fourth control circuit is configured to control the level of the second control node under control of the level of the first node;
the first node noise reduction circuit is connected to the first node, the second node, and the third node, and the first node noise reduction circuit is configured to perform noise reduction on the first node under control of the level of the second node or the level of the third node; and
the output noise reduction circuit is connected to the output terminal, the second node, and the third node, and the output noise reduction circuit is configured to perform noise reduction on the output terminal under control of the level of the second node or the level of the third node.

4. The shift register unit according to claim 3, wherein the input circuit comprises a fourth transistor,
a gate electrode of the fourth transistor is connected to a first electrode of the fourth transistor and is connected to an input terminal to receive the input signal, and a second electrode of the fourth transistor is connected to the first node.

5. The shift register unit according to claim 3, wherein the output terminal of the output circuit comprises at least one shift signal output terminal and at least one pixel signal output terminal.

6. The shift register unit according to claim 5, wherein the output circuit comprises a fifth transistor, a sixth transistor, and a second capacitor;
a gate electrode of the fifth transistor is connected to the first node, a first electrode of the fifth transistor is connected to a clock signal terminal to receive the clock signal, and a second electrode of the fifth transistor is connected to the shift signal output terminal;
a gate electrode of the sixth transistor is connected to the first node, a first electrode of the sixth transistor is connected to the clock signal terminal to receive the clock signal, and a second electrode of the sixth transistor is connected to the pixel signal output terminal; and
a first electrode of the second capacitor is connected to the first node, and a second electrode of the second capacitor is connected to the second electrode of the sixth transistor or the second electrode of the fifth transistor.

7. The shift register unit according to claim 5, wherein the output noise reduction circuit comprises an eighteenth transistor, a nineteenth transistor, a twentieth transistor, and a twenty-first transistor;
a gate electrode of the eighteenth transistor is connected to the second node, a first electrode of the eighteenth transistor is connected to the shift signal output terminal, and a second electrode of the eighteenth transistor is connected to a first voltage terminal to receive a first voltage;

a gate electrode of the nineteenth transistor is connected to the third node, a first electrode of the nineteenth transistor is connected to the shift signal output terminal, and a second electrode of the nineteenth transistor is connected to the first voltage terminal;

a gate electrode of the twentieth transistor is connected to the second node, a first electrode of the twentieth transistor is connected to the pixel signal output terminal, and a second electrode of the twentieth transistor is connected to a fourth voltage terminal to receive a fourth voltage; and a gate electrode of the twenty-first transistor is connected to the third node, a first electrode of the twenty-first transistor is connected to the pixel signal output terminal, and a second electrode of the twenty-first transistor is connected to the fourth voltage terminal.

8. The shift register unit according to claim 3, wherein the first control circuit comprises an eighth transistor and a ninth transistor, a gate electrode of the eighth transistor is connected to the first control node, a first electrode of the eighth transistor is connected to a second voltage terminal to receive a second voltage, a second electrode of the eighth transistor is connected to the second node, a gate electrode of the ninth transistor is connected to the first node, a first electrode of the ninth transistor is connected to the second node, and a second electrode of the ninth transistor is connected to a first voltage terminal to receive a first voltage; and the second control circuit comprises a tenth transistor and an eleventh transistor, a gate electrode of the tenth transistor is connected to the second control node, a first electrode of the tenth transistor is connected to a third voltage terminal to receive a third voltage, a second electrode of the tenth transistor is connected to the third node, a gate electrode of the eleventh transistor is connected to the first node, a first electrode of the eleventh transistor is connected to the third node, and a second electrode of the eleventh transistor is connected to the first voltage terminal.

9. The shift register unit according to claim 3, wherein the third control circuit comprises a twelfth transistor and a thirteenth transistor, a gate electrode of the twelfth transistor is connected to a first electrode of the twelfth transistor and is connected to a second voltage terminal to receive a second voltage, a second electrode of the twelfth transistor is connected to the first control node, a gate electrode of the thirteenth transistor is connected to the first node, a first electrode of the thirteenth transistor is connected to the first control node, and a second electrode of the thirteenth transistor is connected to a first voltage terminal to receive a first voltage; and the fourth control circuit comprises a fourteenth transistor and a fifteenth transistor, a gate electrode of the fourteenth transistor is connected to a first electrode of the fourteenth transistor and is connected to a third voltage terminal to receive a third voltage, a second electrode of the fourteenth transistor is connected to the second control node, a gate electrode of the fifteenth transistor is connected to the first node, a first electrode of the fifteenth transistor is connected to the second control node, and a second electrode of the fifteenth transistor is connected to the first voltage terminal.

10. The shift register unit according to claim 3, wherein the first node noise reduction circuit comprises a sixteenth transistor and a seventeenth transistor;

a gate electrode of the sixteenth transistor is connected to the second node, a first electrode of the sixteenth transistor is connected to the first node, and a second electrode of the sixteenth transistor is connected to a first voltage terminal to receive a first voltage; and a gate electrode of the seventeenth transistor is connected to the third node, a first electrode of the seventeenth transistor is connected to the first node, and a second electrode of the seventeenth transistor is connected to the first voltage terminal.

11. The shift register unit according to claim 3, further comprising a second reset circuit, wherein the second reset circuit is connected to the first node, and the second reset circuit is configured to reset the first node in response to a second reset signal.

12. The shift register unit according to claim 11, wherein the second reset circuit comprises a twenty-second transistor; and a gate electrode of the twenty-second transistor is connected to a second reset terminal to receive the second reset signal, a first electrode of the twenty-second transistor is connected to the first node, and a second electrode of the twenty-second transistor is connected to a first voltage terminal to receive a first voltage.

13. The shift register unit according to claim 1, wherein the first reset circuit comprises a seventh transistor; and a gate electrode of the seventh transistor is connected to the reset control node, a first electrode of the seventh transistor is connected to the first node, and a second electrode of the seventh transistor is connected to a first voltage terminal to receive a first voltage.

14. A method of driving the shift register unit according to claim comprising:

in an input phase, the input circuit controlling the level of the first node to a first level in response to the input signal, and the output circuit outputting a second level of the clock signal to the output terminal;

in an output phase, the output circuit outputting a third level of the clock signal to the output terminal; and in a first reset phase, the reset control circuit inputting the first reset signal to the first reset circuit in response to the reset control signal and the reference signal, to turn on the first reset circuit and to enable the first reset circuit to reset the first node.

15. The method of driving the shift register unit according to claim 14, wherein the clock signal and the reference signal are a same signal, the clock signal and the reference signal are periodic pulses in the input phase and in the output phase, and the clock signal and the reference signal are direct current signals in the first reset phase.

16. A gate drive circuit, comprising a shift register unit, wherein the shift register unit comprises an input circuit, an output circuit, a first reset circuit, and a reset control circuit;

the input circuit is connected to a first node, and the input circuit is configured to control a level of the first node in response to an input signal;

the output circuit is connected to the first node and an output terminal, and the output circuit is configured to output a clock signal to the output terminal under control of the level of the first node;

the first reset circuit is connected to the first node, and the first reset circuit is configured to reset the first node in response to a first reset signal; and the reset control circuit is connected to the first reset circuit, the reset control circuit is configured to, in response to a reset control signal and a reference signal, input the first reset signal to the first reset circuit to turn on the first reset circuit, and the reset control circuit is further configured to enable an amplitude of a level of the first reset signal to be larger than an amplitude of a level of the reference signal, wherein the reset control circuit comprises:

a drive sub-circuit, connected to a reset control node, and configured to adjust a level of the reset control node according to the reset control signal and the reference signal, and the level of the reset control node is used as the first reset signal; and a reset sub-circuit, connected to the reset control node, and configured to reset the reset control node and the drive sub-circuit in response to a reset sub-signal, wherein the drive sub-circuit comprises a first capacitor and a first transistor, a first electrode of the first capacitor is connected to a reset control signal terminal to receive the reset control signal, a second electrode of the first capacitor is connected to a reference signal terminal to receive the reference signal, a gate electrode of the first transistor is connected to the first electrode of the first capacitor, a first electrode of the first transistor is connected to the second electrode of the first capacitor, and a second electrode of the first transistor is connected to the reset control node; and the reset sub-circuit comprises a second transistor and a third transistor, a gate electrode of the second transistor is connected to a reset sub-signal terminal to receive the reset sub-signal, a first electrode of the second transistor is connected to the gate electrode of the first transistor, a second electrode of the second transistor is connected to a first voltage terminal to receive a first voltage, a gate electrode of the third transistor is connected to the reset sub-signal terminal to receive the reset sub-signal, a first electrode of the third transistor is connected to the reset control node, and a second electrode of the third transistor is connected to the first voltage terminal.

17. A display device, comprising a gate drive circuit, wherein the gate drive circuit comprises a shift register unit, and the shift register unit comprises an input circuit, an output circuit, a first reset circuit, and a reset control circuit;

the input circuit is connected to a first node, and the input circuit is configured to control a level of the first node in response to an input signal;

the output circuit is connected to the first node and an output terminal, and the output circuit is configured to output a clock signal to the output terminal under control of the level of the first node;

the first reset circuit is connected to the first node, and the first reset circuit is configured to reset the first node in response to a first reset signal; and the reset control circuit is connected to the first reset circuit, the reset control circuit is configured to, in response to a reset control signal and a reference signal, input the first reset signal to the first reset circuit to turn on the first reset circuit, and the reset control circuit is further configured to enable an amplitude of a level of the first reset signal to be larger than an amplitude of a level of the reference signal, wherein the reset control circuit comprises:

a drive sub-circuit, connected to a reset control node, and configured to adjust a level of the reset control node according to the reset control signal and the reference signal, and the level of the reset control node is used as the first reset signal; and a reset sub-circuit, connected to the reset control node, and configured to reset the reset control node and the drive sub-circuit in response to a reset sub-signal, wherein the drive sub-circuit comprises a first capacitor and a first transistor, a first electrode of the first capacitor is connected to a reset control signal terminal to receive the reset control signal, a second electrode of the first capacitor is connected to a reference signal terminal to receive the reference signal, a gate electrode of the first transistor is connected to the first electrode of the first capacitor, a first electrode of the first transistor is connected to the second electrode of the first capacitor, and a second electrode of the first transistor Is connected to the reset control node; and the reset sub-circuit comprises a second transistor and a third transistor, a gate electrode of the second transistor is connected to a reset sub-signal terminal to receive the reset sub-signal, a first electrode of the second transistor is connected to the gate electrode of the first transistor, a second electrode of the second transistor is connected to a first voltage terminal to receive a first voltage, a oate electrode of the third transistor is connected to the reset sub-signal terminal to receive the reset sub-signal, a first electrode of the third transistor is connected to the reset control node, and a second electrode of the third transistor is connected to the first voltage terminal.

\* \* \* \* \*